US008269267B2

(12) United States Patent
Arai et al.

(10) Patent No.: US 8,269,267 B2
(45) Date of Patent: Sep. 18, 2012

(54) NONVOLATILE SEMICONDUCTOR MEMORY

(75) Inventors: Fumitaka Arai, Yokohama (JP); Ichiro Mizushima, Yokohama (JP); Makoto Mizukami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/904,231

(22) Filed: Oct. 14, 2010

(65) Prior Publication Data
US 2011/0024827 A1 Feb. 3, 2011

Related U.S. Application Data

(62) Division of application No. 11/963,046, filed on Dec. 21, 2007, now Pat. No. 7,829,948.

(30) Foreign Application Priority Data

Dec. 22, 2006 (JP) .................................. 2006-346501

(51) Int. Cl.
*H01L 29/00* (2006.01)
(52) U.S. Cl. ..... 257/324; 257/316; 257/326; 257/E29.3; 257/E21.409
(58) Field of Classification Search .......... 257/314–360, 257/67
See application file for complete search history.

(56) References Cited

U.S. PATENT DOCUMENTS

| | | | |
|---|---|---|---|
| 7,393,748 B2 | 7/2008 | Arai et al. | |
| 7,432,561 B2 | 10/2008 | Mizukami et al. | |
| 7,459,748 B2 | 12/2008 | Shirota et al. | |
| 7,528,447 B2 | 5/2009 | Enda et al. | |
| 7,651,930 B2 | 1/2010 | Suzuki et al. | |
| 7,696,559 B2 | 4/2010 | Arai et al. | |
| 7,777,227 B2 | 8/2010 | Watanabe et al. | |
| 7,777,270 B2 | 8/2010 | Kinoshita et al. | |
| 2002/0158273 A1 | 10/2002 | Satoh et al. | |
| 2006/0049449 A1 | 3/2006 | Iino et al. | |
| 2006/0237706 A1 | 10/2006 | Enda et al. | |
| 2006/0270189 A1 | 11/2006 | Ogita et al. | |
| 2007/0128815 A1 | 6/2007 | Iino et al. | |
| 2008/0073695 A1 | 3/2008 | Mizukami et al. | |
| 2009/0014828 A1 | 1/2009 | Mizushima et al. | |
| 2010/0117135 A1 | 5/2010 | Mizukami et al. | |

FOREIGN PATENT DOCUMENTS

| | | |
|---|---|---|
| JP | 10-41413 | 2/1998 |
| JP | 11-163303 | 6/1999 |
| JP | 2006-73939 | 3/2006 |
| JP | 2006-310651 | 11/2006 |
| JP | 2007-110029 | 4/2007 |
| JP | 2008-153451 | 7/2008 |

OTHER PUBLICATIONS

Office Action issued Oct. 21, 2011, in Taiwanese Patent Application No. 096149094.
Office Action issued Mar. 8, 2011 in Japan Application No. 2006-346501 (With English Translation).

*Primary Examiner* — Mamadou Diallo
(74) *Attorney, Agent, or Firm* — Oblon, Spivak, McClelland, Maier & Neustadt, L.L.P.

(57) ABSTRACT

A nonvolatile semiconductor memory according to an aspect of the invention comprises a semiconductor substrate which has an SOI region and an epitaxial region at its surface, a buried oxide film arranged on the semiconductor substrate in the SOI region, an SOI layer arranged on the buried oxide film, a plurality of memory cells arranged on the SOI layer, an epitaxial layer arranged in the epitaxial region, and a select gate transistor arranged on the epitaxial layer, wherein the SOI layer is made of a microcrystalline layer.

12 Claims, 20 Drawing Sheets

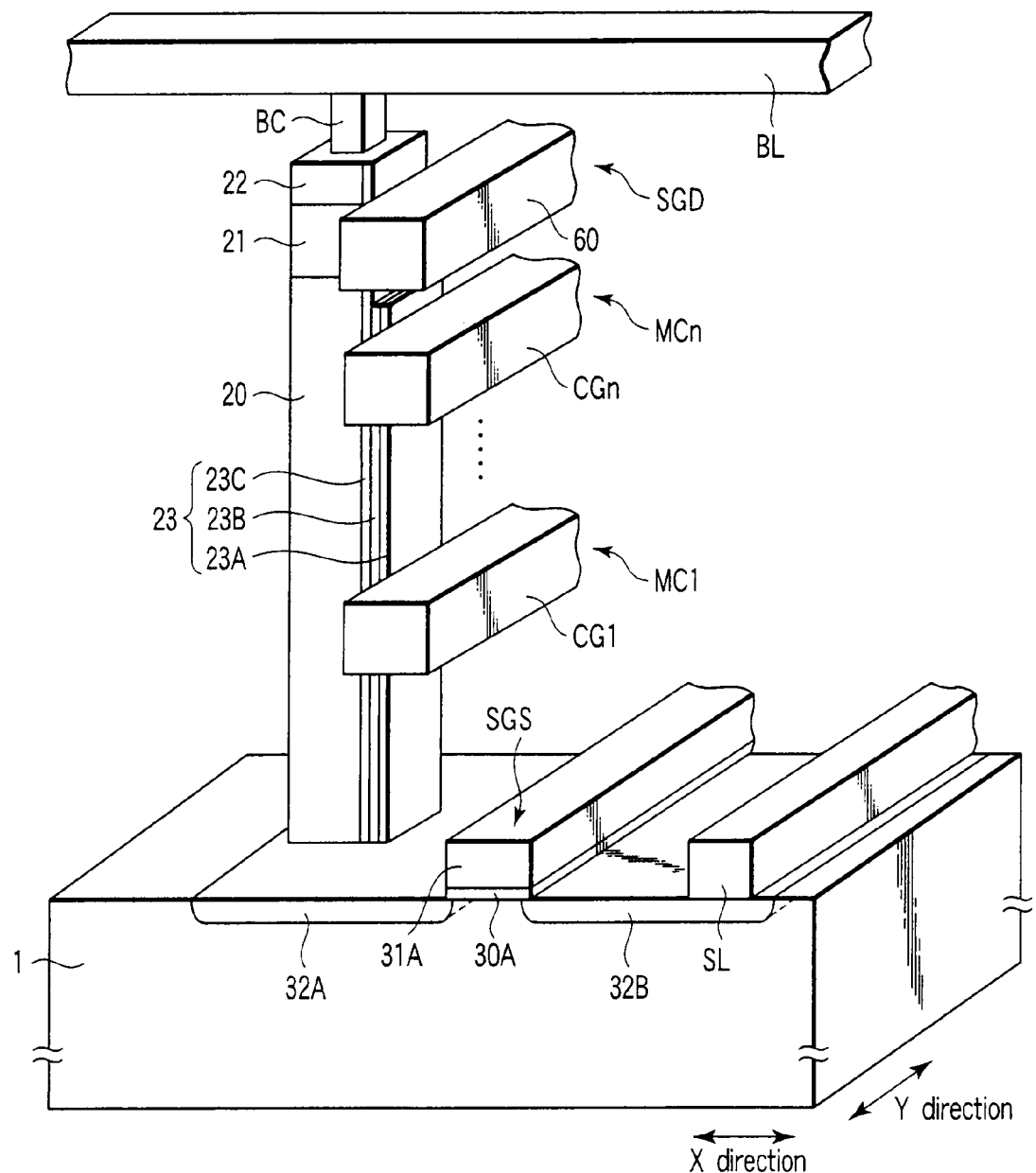
F I G. 24

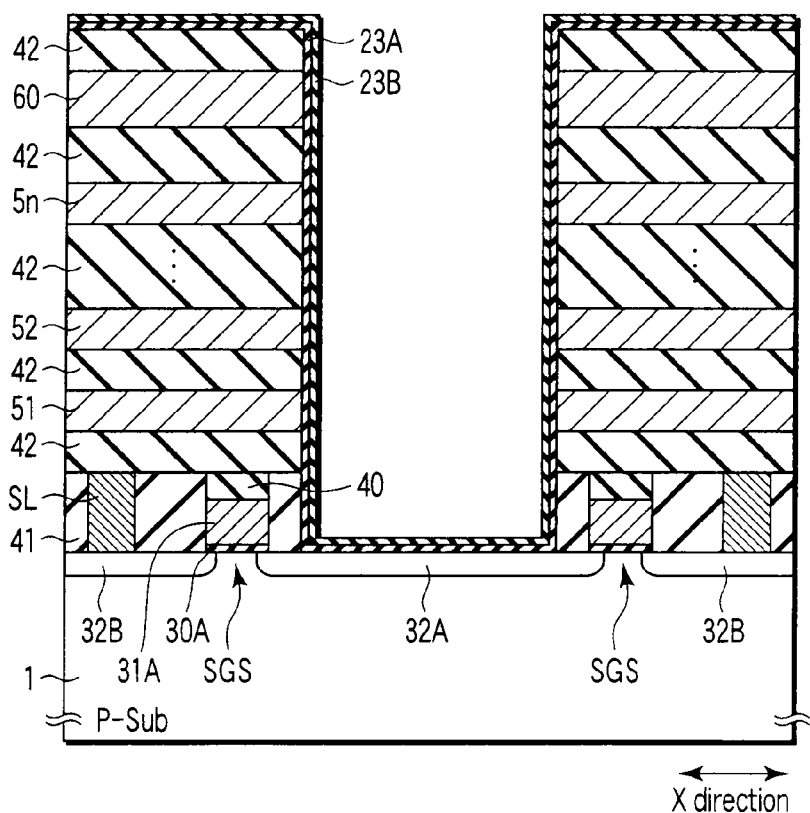
F I G. 31
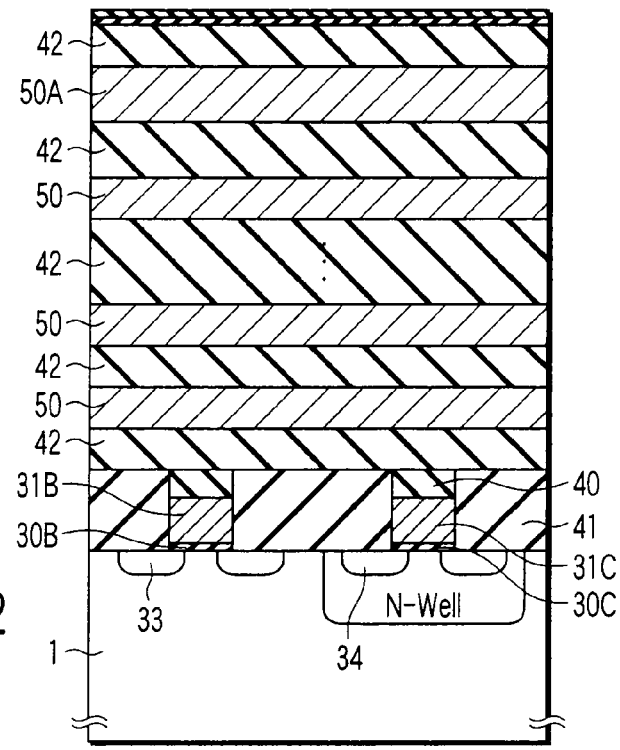
F I G. 32

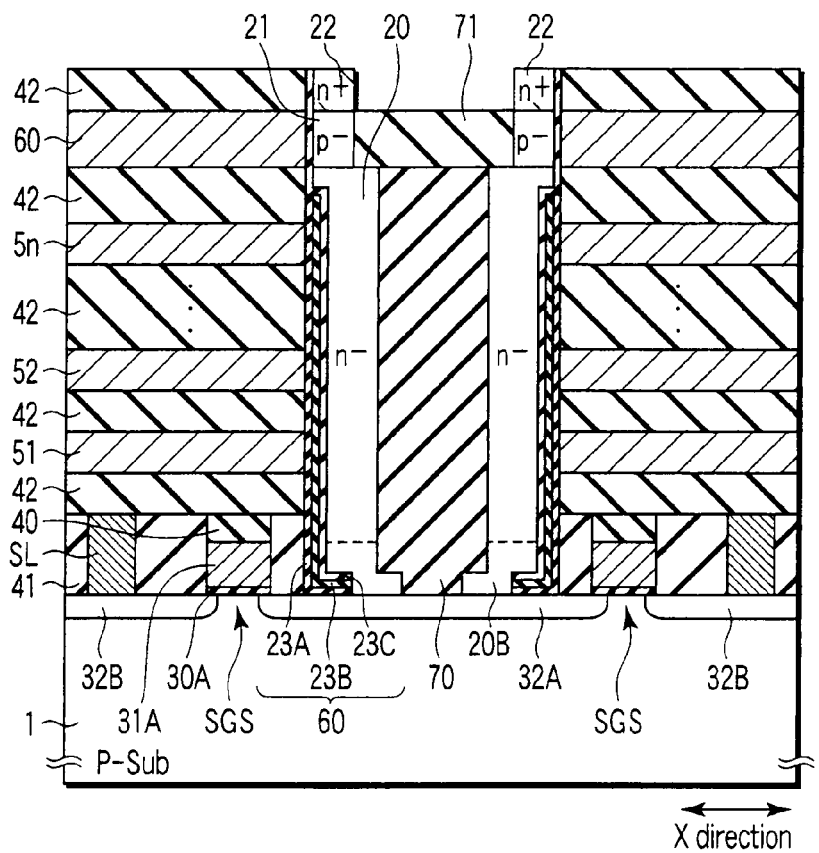
F I G. 41
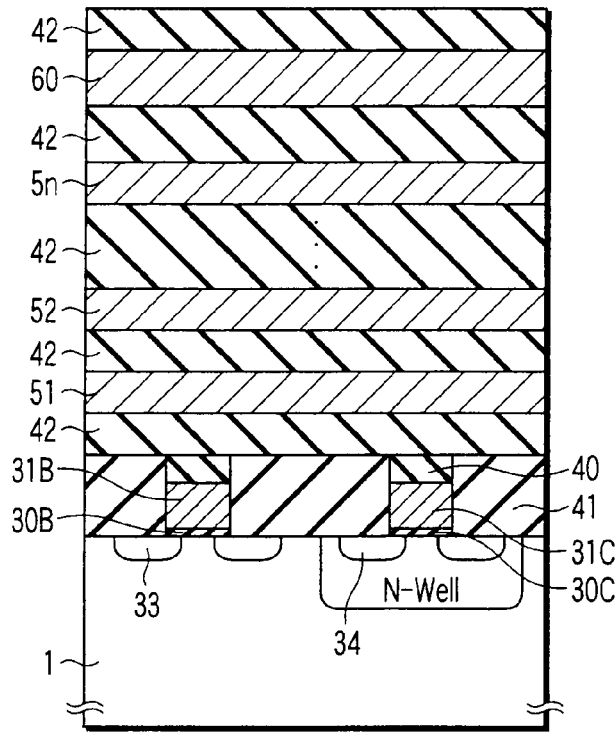
F I G. 42

NONVOLATILE SEMICONDUCTOR MEMORY

CROSS-REFERENCE TO RELATED APPLICATIONS

This application is a divisional of U.S. application Ser. No. 11/963,046 filed Dec. 21, 2007 and is based upon and claims the benefit of priority from prior Japanese Patent Application No. 2006-346501, filed Dec. 22, 2006, the entire contents of each of which are incorporated herein by reference.

BACKGROUND OF THE INVENTION

1. Field of the Invention

This invention relates to a nonvolatile semiconductor memory, and more particularly to a NAND flash memory having a partial SOI structure.

2. Description of the Related Art

A nonvolatile semiconductor memory, such as a NAND flash memory, has been used as a storage unit for various electronic devices.

As memory capacity and integration have been growing in recent years, the memory cells have been microfabricated further.

The technique for forming memory cells in a silicon-on-insulator (SOI) region provided at the surface of a semiconductor substrate has been proposed as a method for microfabrication (e.g., Jpn. Pat. Appln. KOKAI Publication No. 2006-73939).

The reason why this technique is used for microfabrication is that the formation of memory cells in the SOI region makes it possible to suppress a short-channel effect caused by microfabrication.

It is desirable to use a highly crystalline epitaxial layer as an SOI layer formed in the SOI region. For this reason, the epitaxial layer is formed so that its crystal axis aligns with that of the semiconductor substrate by epitaxially growing an amorphous film covering the entire surface of the substrate in the lateral direction using the top surface of the exposed semiconductor substrate not covered with a buried oxide film.

However, the epitaxial layer on the aforementioned buried oxide film inevitably contains many grain boundaries. Since the grain boundaries are formed at random in the epitaxial layer, the memory cell characteristic varies between a memory cell with a crystal grain boundary in the channel region and a memory cell with no crystal grain boundary.

The variation becomes significant as the memory cells are microfabricated more, which decreases the reliability of the flash memory.

BRIEF SUMMARY OF THE INVENTION

According to an aspect of the present invention, there is provided a nonvolatile semiconductor memory comprising: a semiconductor substrate which has an SOI region and an epitaxial region at its surface; a buried oxide film arranged on the semiconductor substrate in the SOI region; an SOI layer arranged on the buried oxide film layer; a plurality of memory cells arranged on the SOI layer; an epitaxial layer arranged in the epitaxial region; and a select gate transistor arranged on the epitaxial layer, wherein the SOI layer is made of a microcrystalline layer.

According to another aspect of the present invention, there is provided a nonvolatile semiconductor memory comprising: a semiconductor substrate; a pillar-shaped semiconductor layer which extends in a vertical direction toward the surface of the semiconductor substrate; a plurality of memory cells which are arranged in the vertical direction on the side face of the semiconductor layer and each of which has a charge accumulation layer and a control gate electrode, wherein the pillar-shaped semiconductor layer is made of a microcrystalline layer.

BRIEF DESCRIPTION OF THE SEVERAL VIEWS OF THE DRAWING

FIG. 24 is a perspective view of a NAND cell unit according to a third embodiment of the invention;

FIG. 31 is a sectional view showing one of the manufacturing processes of the third embodiment;

FIG. 32 is a sectional view showing one of the manufacturing processes of the third embodiment;

FIG. 41 is a sectional view showing one of the manufacturing processes of the third embodiment;

FIG. 42 is a sectional view showing one of the manufacturing processes of the third embodiment;

DETAILED DESCRIPTION OF THE INVENTION

Hereinafter, referring to the accompanying drawings, embodiments of the invention will be explained in detail.

1. Outline

A nonvolatile semiconductor memory according to an embodiment of the invention has a partial SOI structure. Specifically, a memory cell is arranged in an SOI region at the surface of a semiconductor substrate and a select gate transistor is arranged in an epitaxial region at the surface of the semiconductor substrate. A peripheral transistor is arranged at the surface of the semiconductor substrate (in the semiconductor substrate region).

In the SOI region of the embodiment, the SOI layer in which memory cells are arranged is characterized by being a microcrystalline silicon layer.

Using a microcrystalline silicon layer as the channels of memory cells causes the channel of each memory cell to have a structure with crystal grain boundaries in microcrystalline silicon.

Consequently, according to the embodiment, it is possible to suppress variations in the memory cell characteristics caused by the presence or absence of a crystal grain boundary in the channel region. In addition to this effect, memory cells with homogeneous characteristics can be provided.

In the embodiment, if the channel length of a memory cell is L and the channel width is W, microcrystalline silicon is defined as silicon whose crystal grain diameter is less than the smaller of L/2 and smaller than W/2.

2. Embodiments

(1) First Embodiment (a) Configuration

Figure 1:
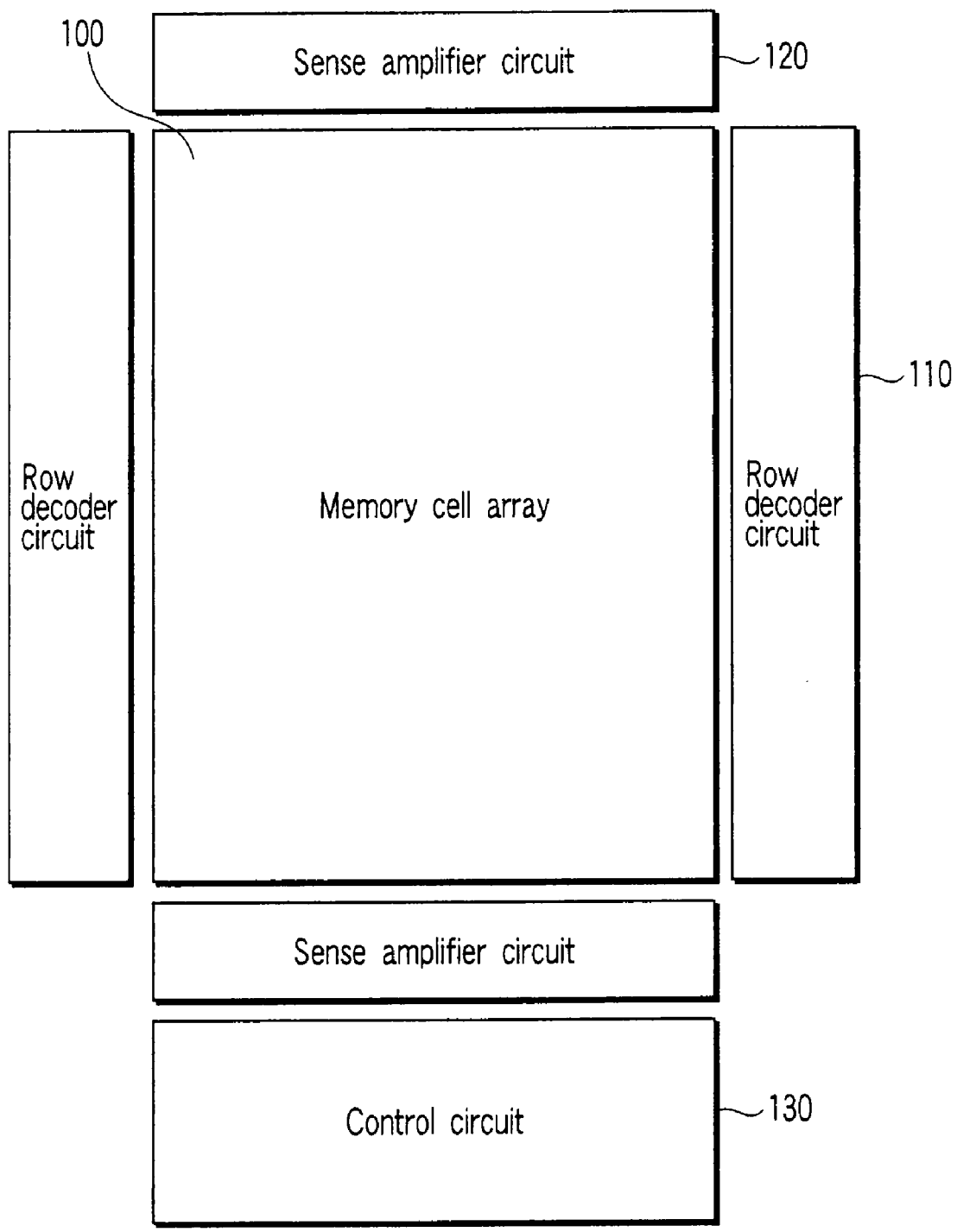
FIG. 1 shows an example of the layout of a flash memory according to a first embodiment of the invention.

FIG. 1 shows an example of the layout of a flash memory according to a first embodiment of the invention.

The flash memory is such that a memory cell array section 100 and a row decoder circuit 110, a sense amplifier circuit 120, a control circuit 130 and others arranged around the memory cell array section are all provided on the same chip. Hereinafter, the area in which the row decoder circuit 110, sense amplifier circuit 120, and control circuit 130 are provided is referred to as a peripheral circuit section.

Figure 2:
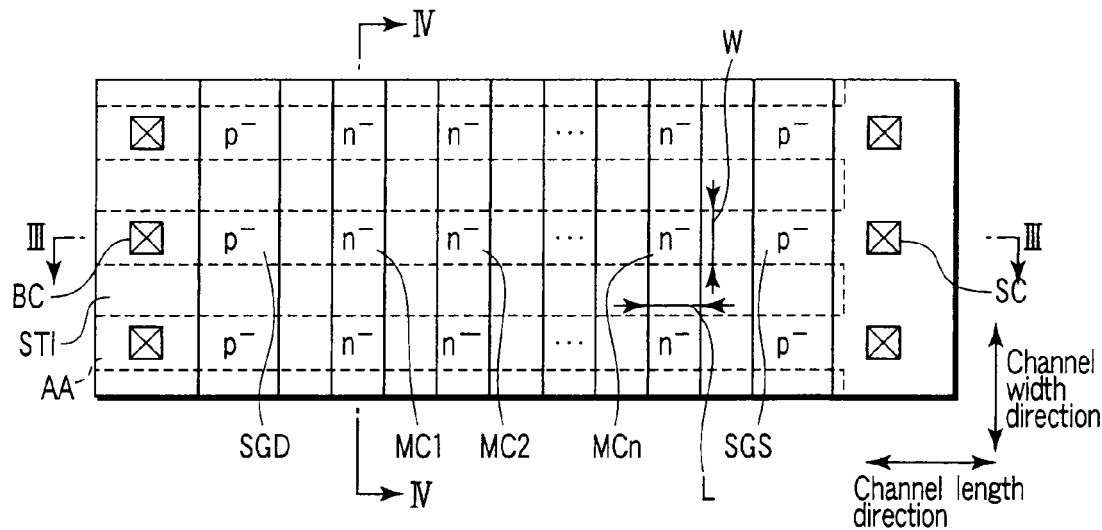
FIG. 2 is a plan view of a memory cell array section according to the first embodiment.
Figure 3:
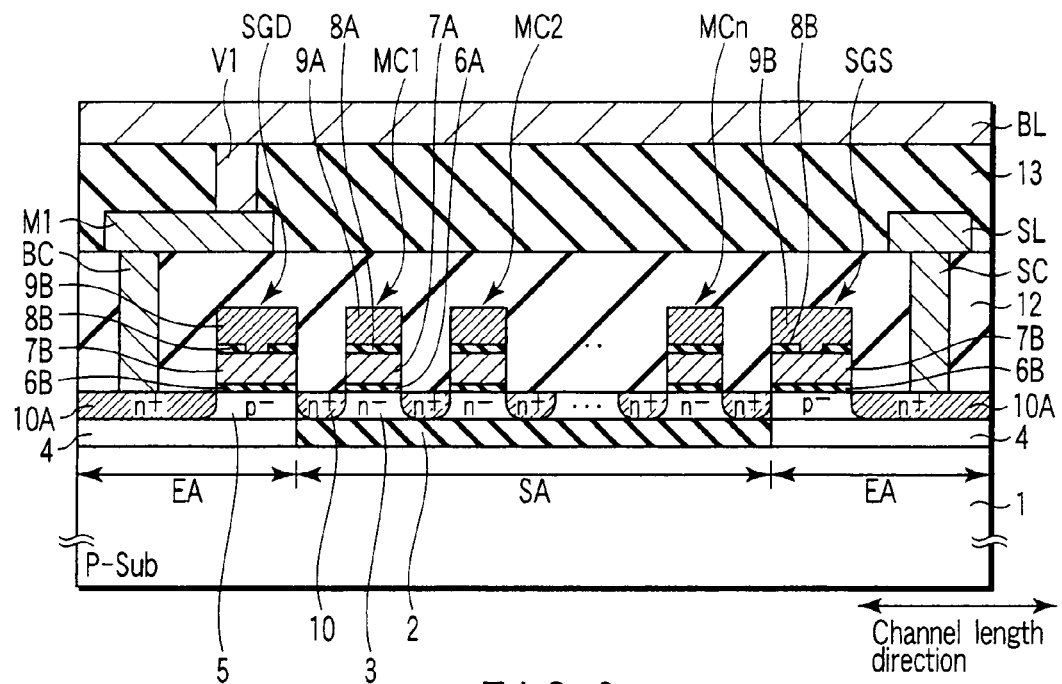
FIG. 3 is a sectional view taken along line III-III of FIG. 2.
Figure 4:
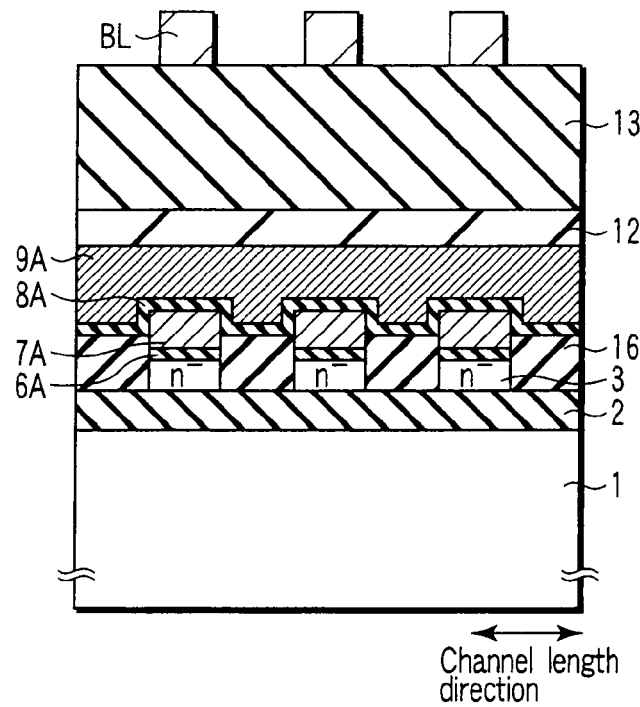
FIG. 4 is a sectional view taken along line IV-IV of FIG. 2.
Figure 5:
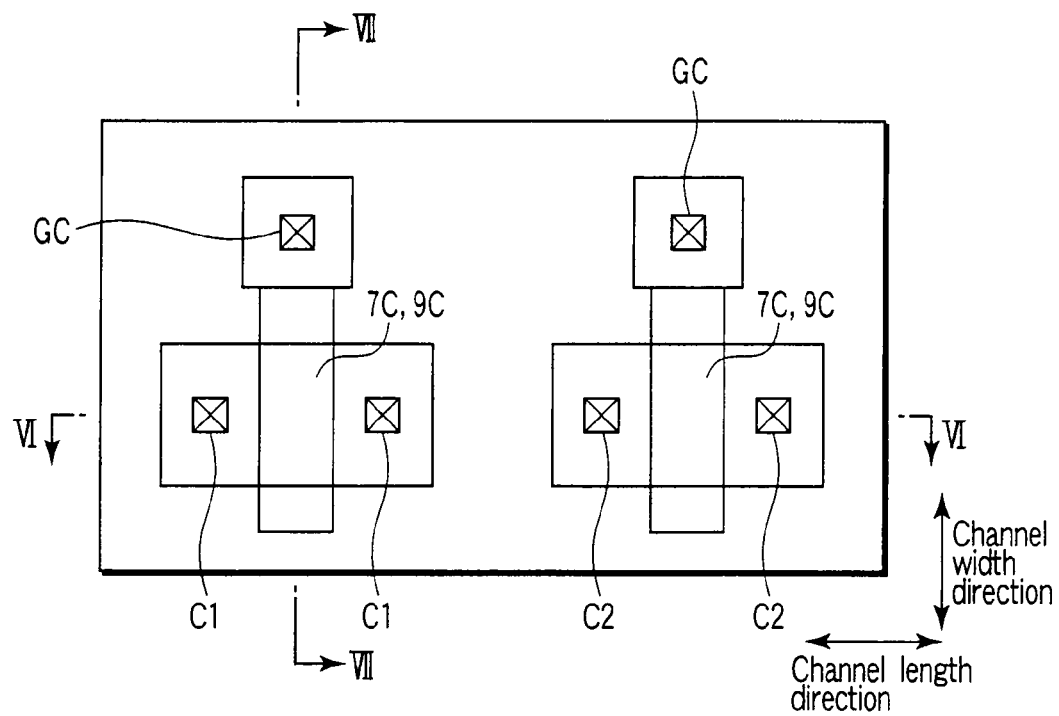
FIG. 5 is a plan view of a peripheral circuit section according to the first embodiment.
Figure 6:
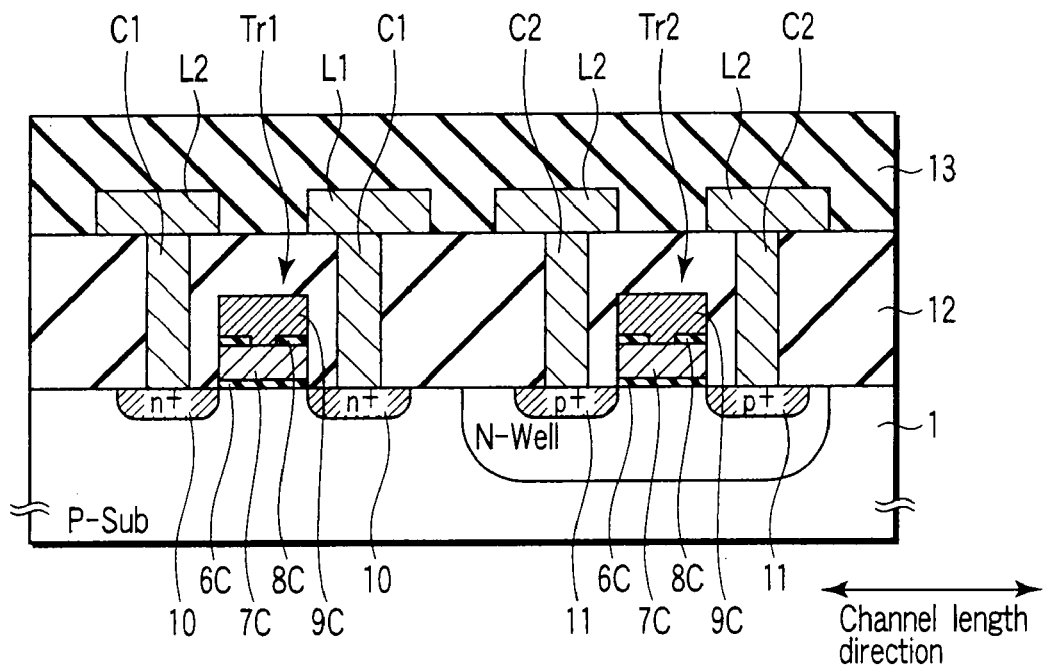
FIG. 6 is a sectional view taken along line VI-VI of FIG. 5.
Figure 7:
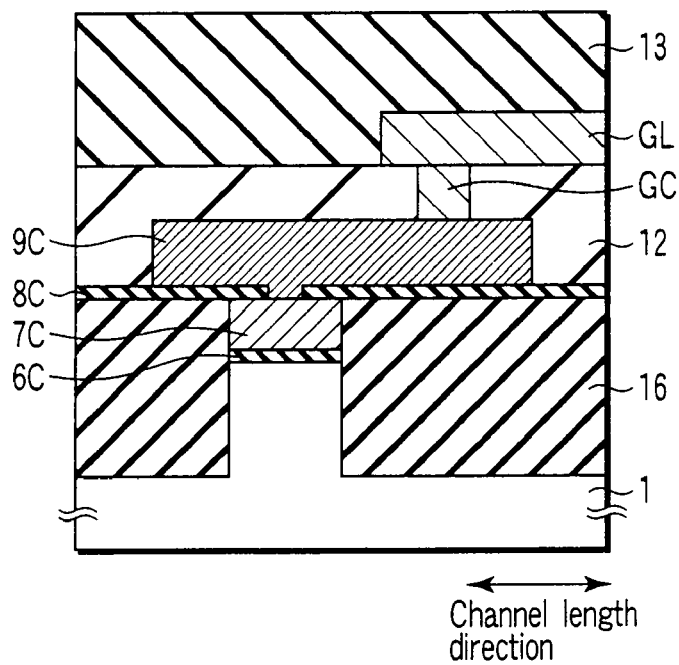
FIG. 7 is a sectional view taken along line VII-VII of FIG. 5.

Using FIGS. 2 to 7, the configuration of the memory cell array section and peripheral circuit section will be explained. FIG. 2 is a plan view of a part of the memory cell array section. FIG. 3 is a sectional view taken along line III-III of FIG. 2. FIG. 4 is a sectional view taken along line IV-IV of FIG. 2. FIG. 5 is a plan view of a part of the peripheral circuit section. FIG. 6 is a sectional view taken along line VI-VI of FIG. 5. FIG. 7 is a sectional view taken along line VII-VII of FIG. 5. In the first embodiment, the direction in which line III-III and line VI-VI extend corresponds to the channel length direction of a MIS transistor and the direction in which line IV-IV and line VII-VII extend corresponds to the channel width direction of a MIS transistor.

As shown in FIG. 2, the surface region of the memory cell array section is composed of, for example, isolation insulating regions STI with a shallow trench isolation (STI) structure and an active region AA sandwiched between them.

As shown in FIG. 3, the active region AA of the memory cell array section is composed of an SOI region SA and an epitaxial region EA, that is, two regions. The SOI region SA is composed of a buried oxide film 2 provided on a semiconductor substrate 1 and an n-type microcrystalline silicon layer 3 which is provided on the buried oxide film 2 and constitutes an SOI layer. The n-type microcrystalline silicon layer 3 is an n⁻-type semiconductor layer doped with a low concentration (for example, about $1 \times 10^{18}$ atom/cm$^3$) of n-type impurities, such as phosphorus (P) or arsenic (As). The film thickness of the n-type microcrystalline silicon layer 3 is, for example, about 30 to 40 nm.

A plurality of memory cells MC1 to MCn are arranged on the n-type microcrystalline silicon layer 3. Each of the memory cells MC1 to MCn has a stacked gate structure composed of a floating gate electrode 7A and a control gate electrode 9A. The floating gate 7A is formed on a gate insulating film (tunnel oxide film) 6A formed at the surface of the n-type microcrystalline silicon layer 3. Floating gate electrodes 7A adjacent to one another in the channel width direction are isolated from one another by an element isolation insulating layer 16 formed in the element isolation region STI. The element isolation insulating layer 16 is formed so as to make contact with the buried oxide film 2. As shown in FIG. 4, the control gate electrode 9A is formed so as to cover the top of and the side face in the channel width direction of the floating gate electrode 7A via an inter-gate insulating film 8A. The control gate electrode 9A functions as a word line. Moreover, an n⁺ diffused layer 10 formed in the n⁻-type microcrystalline silicon layer 3 acting as an SOI layer is shared as a source/drain region by two adjacent memory cells so as to connect the two memory cells in series.

In the first embodiment, each of the memory cells MC1 to MCn is composed of an SOI-structure depletion-mode transistor which uses the n-type microcrystalline silicon layer 3 as a channel region and the n+ diffused layer 10 as a source/drain region. Therefore, with charges (electrons) being accumulated in the floating gate electrode 7A, the channel region is depleted, which enables the influence of the short channel effect to be alleviated.

Select gate transistors SGD, SGS are provided at one end (drain side) of and the other end (source side) of the memory cells MC1 to MCn. The select gate transistors SGD, SGS are arranged in an epitaxial region EA and use as a channel region a p⁻-type semiconductor layer 5 whose crystal axis aligns with that of the semiconductor substrate 1.

Since the gate electrodes of the select gate transistors SGS, SGD are formed at the same time that the gate electrodes of the memory cells are formed, they have a stacked gate structure. Therefore, the structure of the gate electrode is such that a gate electrode 7B formed on a gate insulating film 6B at the surface of the p⁻-type semiconductor layer 5 is connected to a gate electrode 9B via an opening made in an inter-gate insulating film 8B.

The select gate transistors SGD, SGS are connected electrically to the memory cells MC1, MCn respectively via an n⁺ diffused layer 10 formed in the microcrystalline silicon layer 3.

Moreover, the select gate transistors SGD, SGS are connected electrically to a bit line contact BC and a source line contact SC respectively via an n⁺ diffused layer 10A formed in the epitaxial region EA. The n⁺ diffused layers 10A are formed in the epitaxial layer.

As described above, each of the select gate transistors SGD, SGS is an enhancement-mode metal insulator semiconductor (MIS) transistor where the p⁻-type semiconductor layer 5, an epitaxial layer, is used as a channel region and the n⁺ diffused layers 10, 10A are used as source-drain regions. The channel length of the select gate transistors SGD, SGS are set greater than the channel length of the memory cells MC1 to MCn. This makes it possible to easily control the cutoff characteristic of the select gate transistors SGD, SGS and improve the cutoff characteristic.

In the first embodiment, the memory cell array section has the configuration of a NAND flash memory in which a plurality of memory cells and the select gate transistors are connected in series in such a manner that they share the source/drain diffused layer.

Hereinafter, using FIGS. 5 to 7, the structure of the peripheral transistor of the first embodiment will be explained. In FIGS. 5 to 7, for ease of explanation, only an n-channel MIS transistor Tr1 and a p-channel MIS transistor Tr2 are shown.

The peripheral transistors Tr1, Tr2 are provided on the semiconductor substrate 1 and are formed at the same time that the memory cells MC1 to MCn and select gate transistors SGD, SGS are formed. Accordingly, they have a stacked gate structure. In the structure, a gate electrode 7C on a gate insulating film 6C at the surface of the semiconductor substrate 1 is connected to a gate electrode 9C via an opening made in an inter-gate insulating film 8C.

The gate electrodes 7C, 9C of the peripheral transistors Tr1, Tr2 are connected via a gate contact GC to a gate wiring layer GL. The peripheral transistors Tr1, Tr2 use the n⁺ diffused layer 10 and p⁺ diffused layer 11 formed in the semiconductor substrate 1 as source/drain regions, respectively. Then, metal wiring layers L1, L2 are connected via contact C1, C2 to the n⁺ and p⁺ diffused layers 10, 11, respectively.

The peripheral transistors Tr1, Tr2 are formed on the semiconductor substrate 1 to function as high withstand voltage transistors. Moreover, they are formed so as to function as enhancement-mode MIS transistors to facilitate threshold voltage control. The peripheral transistors Tr1, Tr2 may be provided on the epitaxial layer formed on the semiconductor substrate 1 as are the select gate transistors SGD, SGS.

As described above, the NAND flash memory of the first embodiment has a partial SOI structure where the memory cell array section is formed in the SOI region on the semiconductor substrate 1 and the peripheral circuit section is formed on the semiconductor substrate 1.

Each of the memory cells MC1 to MCn uses an n-type microcrystalline silicon layer 3 as a channel region. If the channel length of a memory cell is L and the channel width of the memory cell is W, the grain diameter r of microcrystalline silicon constituting the n-type microcrystalline silicon layer 3 is designed to be less than the smaller L/2 and W/2.

For this reason, each of the memory cells MC1 to MCn has a grain boundary in microcrystalline silicon. Therefore, the characteristics of the memory cells do not vary, depending on the presence or absence of a grain boundary in each memory cell.

Therefore, according to the first embodiment, making the SOI layer of microcrystal silicon enables crystal grain boundaries to be mediated in the channel regions of all the memory cells and the characteristics of the memory cells to be equalized.

(b) Manufacturing Method

Using FIGS. 8 to 17, a method of manufacturing a flash memory in the first embodiment will be explained. FIGS. 8, 10, 12, 14, and 16 show the manufacturing processes of a cross section in the channel length direction of the memory cell array section. FIGS. 9, 11, 13, 15, and 17 show the manufacturing processes of a cross section in the channel length direction of the peripheral circuit section.

Figure 8:
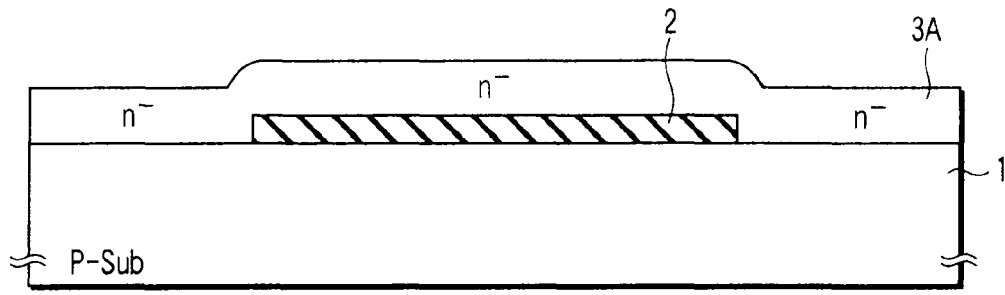
FIG. 8 is a sectional view showing one of the manufacturing processes of the first embodiment.
Figure 9:
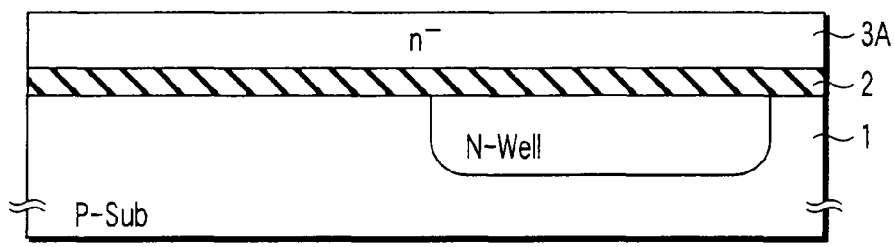
FIG. 9 is a sectional view showing one of the manufacturing processes of the first embodiment.

As shown in FIGS. 8 and 9, a well region is formed in the semiconductor substrate 1 and a buried oxide film 2, such as a silicon oxide film, is formed at the surface of the semiconductor substrate 1 by chemical vapor deposition (CVD) method. Thereafter, in the memory cell array section of FIG. 8, the silicon oxide film 2 is patterned so as to leave a silicon oxide film in a region in which memory cells are to be formed in a subsequent process and then etching is done by, for example, reactive ion etching (RIE) method. Then, in the memory cell array section, a buried oxide film 2 is formed on the semiconductor substrate 1 in a part which will be an SOI region in a subsequent process. In a part which will be an epitaxial region in a subsequent process, the semiconductor substrate 1 is exposed.

As shown in FIG. 9, in the peripheral circuit section, the surface of the semiconductor substrate 1 is covered with the buried oxide film 2. When a peripheral transistor is formed on the epitaxial layer, the buried oxide film 2 of the peripheral circuit section will be removed.

Then, an amorphous silicon film 3A which contains a low concentration (for example, about $1 \times 10^{18}$ atom/cm³) of n-type impurities, such as phosphorus (P) or arsenic (As), is formed on the entire surface of the memory cell array section and peripheral circuit section.

The entire surface of the semiconductor substrate 1 is heat-treated with a sharp temperature rise by, for example, rapid thermal annealing (RTA) method under the conditions where the substrate temperature is 600° C. or higher, thereby causing the amorphous silicon film 3A to grow epitaxially in a short time. Thereafter, for example, the surface is planarized by, for example, chemical mechanical polishing (CMP) method.

Figure 10:
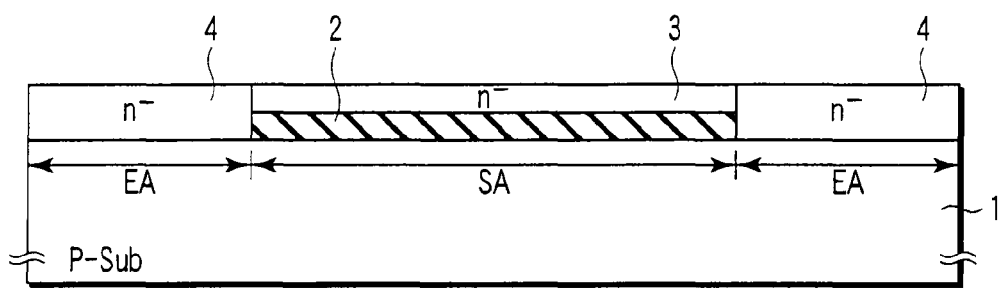
FIG. 10 is a sectional view showing one of the manufacturing processes of the first embodiment.

Then, as shown in FIG. 10, amorphous silicon deposited so as to make contact with the surface of the semiconductor substrate 1 grows epitaxially by RTA method, producing an epitaxial silicon layer 4 whose crystal axis aligns with that of the semiconductor substrate 1. On the other hand, the amorphous silicon deposited so as to make contact with the surface of the buried oxide film 2 makes a microcrystalline silicon layer 3 having grain boundaries.

The reason why the above structure is obtained is that the amorphous silicon film grows epitaxially in the epitaxial region EA on the semiconductor substrate 1 and that the amorphous silicon film does not grow epitaxially in the SOI region SA because it is in contact with the buried oxide film 2, an amorphous film, and the amorphous silicon film crystallizes as a result of a sharp temperature change caused by RTA method.

In the first embodiment, since the crystallization of amorphous silicon is performed by a short-duration heat treatment using RTA, the crystal growth in the lateral direction (or in a direction parallel to the substrate surface) ends in a much shorter period than the crystal growth in the longitudinal direction (or in a direction perpendicular to the substrate surface). For this reason, an epitaxial silicon layer 4 grown in crystal in the epitaxial region EA does not grow in the lateral direction so as to cover the entire surface of the buried oxide film 2. The substrate heating time by RTA is the time required for the amorphous silicon film in the epitaxial region EA to grow epitaxially as far as its top surface.

Figure 11:
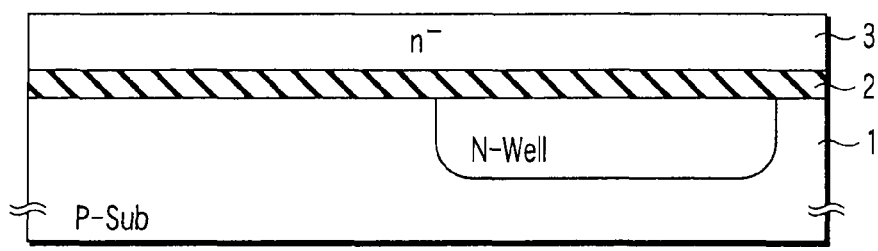
FIG. 11 is a sectional view showing one of the manufacturing processes of the first embodiment.

In the memory cell array section, a microcrystalline silicon layer 3 and an epitaxial layer 4 can be formed separately as are the SOI region and epitaxial region in FIG. 10. In the peripheral circuit section, when the buried oxide film 2 is not removed as shown in FIG. 11, a microcrystalline silicon layer 3 is formed on the buried oxide film 2 as in the memory cell array section.

Figure 12:
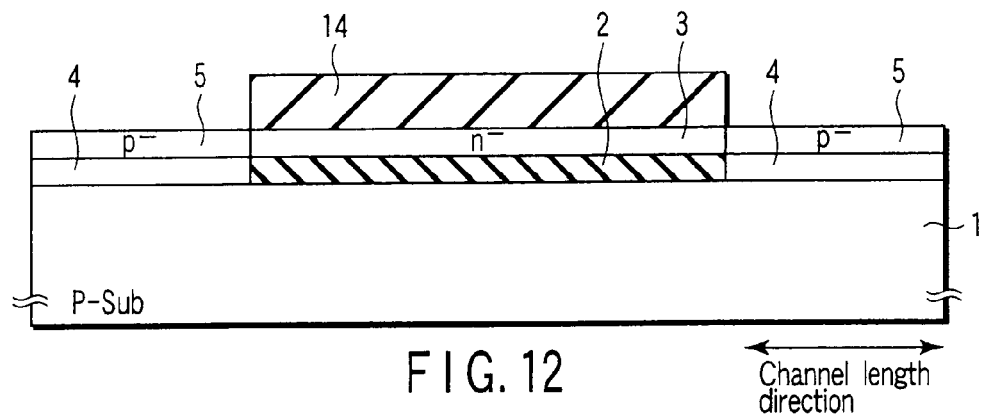
FIG. 12 is a sectional view showing one of the manufacturing processes of the first embodiment.
Figure 13:
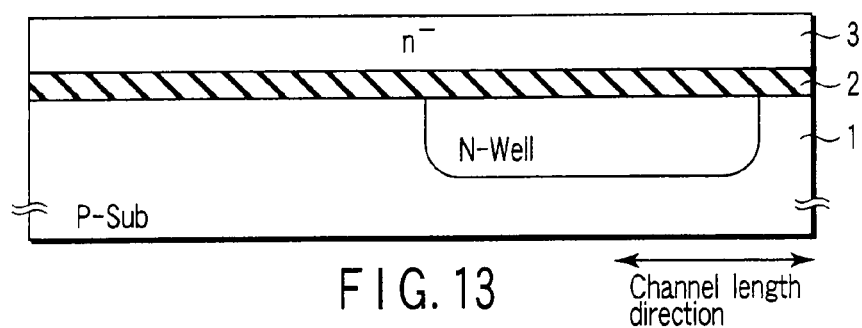
FIG. 13 is a sectional view showing one of the manufacturing processes of the first embodiment.

Then, as shown in FIGS. 12 and 13, after resist is applied to the semiconductor substrate, a resist pattern 14 patterned so as to expose an epitaxial region EA to serve as a select gate transistor formation region is formed on the microcrystalline silicon layer 3 in the memory cell array section. Then, with the resist pattern 14 as a mask, the epitaxial silicon layer in the epitaxial region EA is doped with a low concentration (for example, about $1\times10^{18}$ atom/cm$^3$) of p-type impurities, such as boron (B), thereby forming a p$^-$-type semiconductor layer 5.

Figure 14:
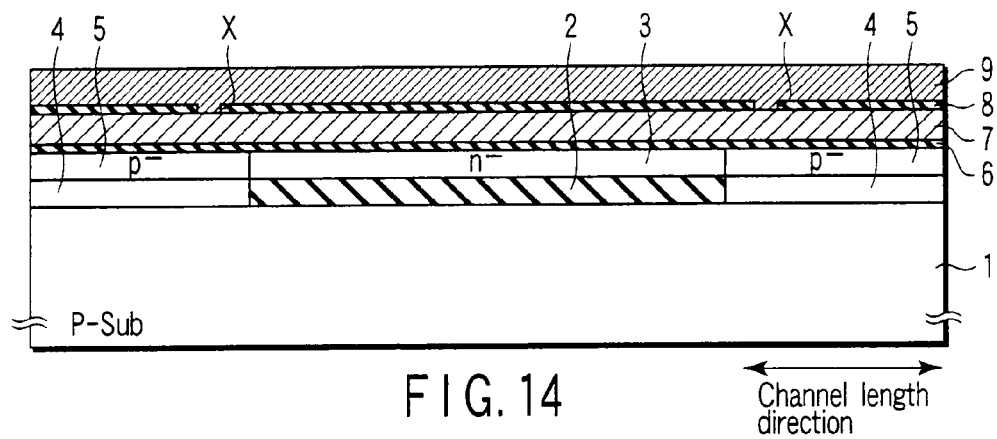
FIG. 14 is a sectional view showing one of the manufacturing processes of the first embodiment.
Figure 15:
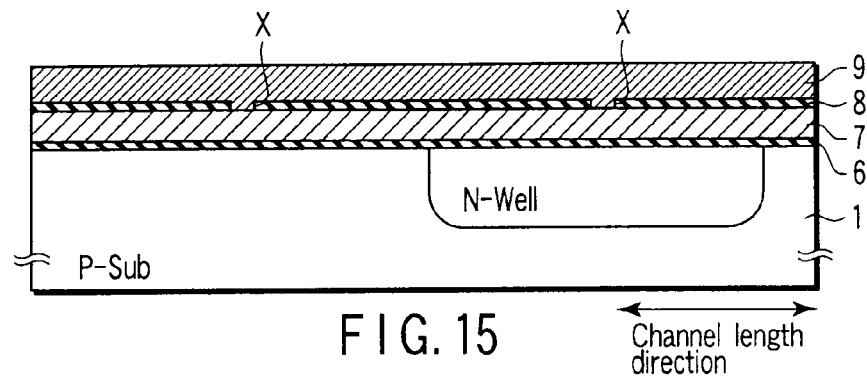
FIG. 15 is a sectional view showing one of the manufacturing processes of the first embodiment.

The resist pattern 14 is removed and the buried oxide film and microcrystalline silicon layer in the peripheral circuit section are peeled, thereby exposing the surface of the semiconductor substrate 1 as shown in FIG. 13. Then, as shown in FIGS. 14 and 15, for example, a silicon oxide film 6 serving as a gate insulating film is formed by a thermal oxidation method on the microcrystalline silicon layer 3 and p$^-$-type semiconductor layer 5 in the memory cell array section and on the semiconductor substrate 1 in the peripheral circuit section.

Then, for example, a polysilicon film 7 continuing the floating gate electrode of a memory cell and the gate electrode of a peripheral transistor is formed on the gate insulating film 6 by CVD method. Thereafter, in the memory cell array section, to separate the floating gate electrodes adjacent in the channel width direction, an isolation insulating layer (not shown) is formed so as to make contact with, for example, the buried oxide film 2, thereby forming an active region and an isolation insulating region separately at the surface of the semiconductor substrate 1. At this time, an isolation insulating layer (not shown) is formed similarly in the semiconductor substrate 1 in the peripheral circuit section.

Furthermore, on the polysilicon film 7 of the memory cell array section and peripheral circuit section, for example, an ONO film 8 serving as an inter-gate insulating film is formed. The inter-gate insulating film is not limited to an ONO film and may be a single layer film of a silicon oxide film, a silicon nitride film, or a silicon oxynitride film. Alternatively, the inter-gate insulating film may be a single layer film or a laminated film containing at least one of the following high dielectric materials: aluminum oxide, hafnium oxide, tantalum oxide, lanthanum oxide, and the like.

An opening X reaching the polysilicon film 7 is made in the ONO film 8 in the select gate transistor formation region and peripheral transistor formation region. Then, for example, a polysilicon film 9 which is to make the control gate of a memory cell and the gate electrode of a peripheral transistor is formed on the ONO film 8 by CVD method. A high-melting-point metal film, such as tungsten (W), titanium (Ti), or molybdenum (Mo) may be further formed on the polysilicon film 9, which is silicified by heat treatment and then formed into a control gate electrode so as to have a two-layer structure of a polysilicon film and a silicide film or a single-layer structure of a silicide film. In this case, the control gate electrode can be caused to have low resistance.

Figure 16:
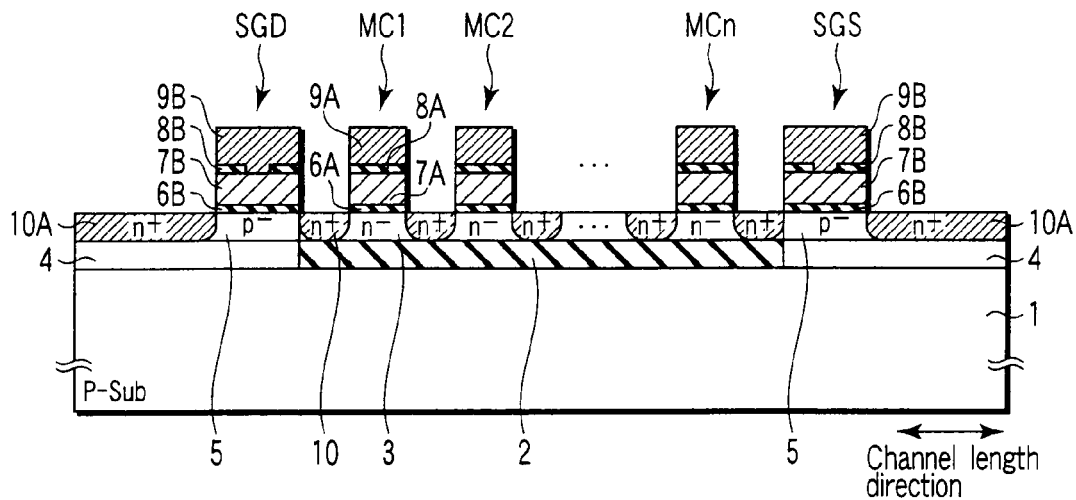
FIG. 16 is a sectional view showing one of the manufacturing processes of the first embodiment.
Figure 17:
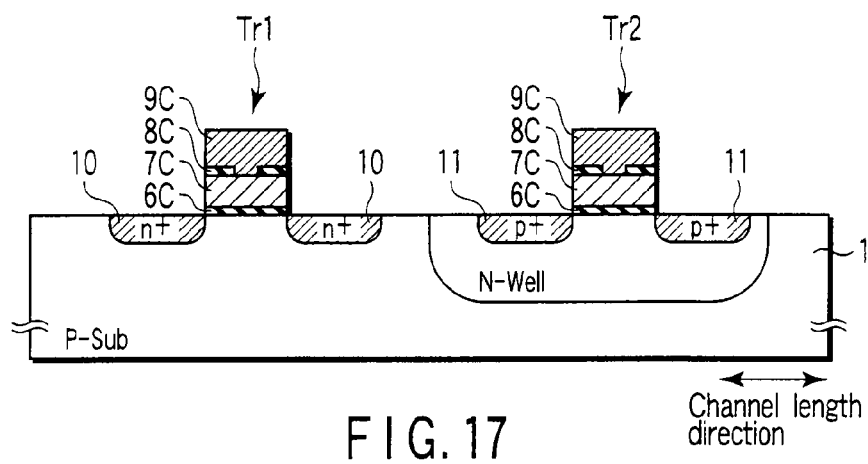
FIG. 17 is a sectional view showing one of the manufacturing processes of the first embodiment.

As shown in FIGS. 16 and 17, after the memory cell array section and peripheral circuit section are patterned so as to obtain a transistor with a specific channel length, the polysilicon film, ONO film, polysilicon film, and silicon oxide film are etched in sequence by RIE method, thereby processing the gates. As a result, the gate electrodes of the memory cells MC1 to MCn, select gate transistors SGD, SGS, and peripheral transistors Tr1, Tr2 are formed.

With the gate electrodes as a mask, n$^+$ diffused layers 10, 10A and a p$^+$ diffused layer 11 which are to constitute source/drain regions are formed in a self-aligning manner by, for example, an ion implantation method, respectively.

Furthermore, as shown in FIGS. 3 and 6, an insulating layer 12 is formed on the entire surface of the memory cell array section and peripheral circuit section. Thereafter, a bit line contact BC and a source line contact SC are connected electrically to the drain of the select gate transistor SGD and the source of the select gate transistor SGS via the openings made in the insulating layer 12. Moreover, a metal wiring layer M1 is connected electrically to the bit line contact BC. A source line SL is connected electrically to the source line contact SC. At this time, in the peripheral circuit section, the metal wiring layers L1, L2 are connected electrically to the diffused layers 10, 11 serving as the source/drain regions of the peripheral transistors Tr1, Tr2 via the contact parts C1, C2 formed in the insulating layer 12. Moreover, gate interconnections and gate contact (not shown) are formed at the gate electrodes 7C, 9C of the peripheral transistors Tr1, Tr2 in the same process.

After an insulating layer 13 is formed on the entire surface of the memory cell array section and peripheral circuit section, bit lines B1 are connected electrically to the metal wiring layer M1 through a via V1 formed in the insulating layer 13.

By the above processes, a flash memory of the first embodiment is completed.

The aforementioned manufacturing method makes it possible to produce a NAND flash memory where an SOI layer in which the memory cells MC1 to MCn are arranged is composed of a microcrystalline silicon layer 3.

Accordingly, crystal grain boundaries can be included in the channel region of each of the memory cells MC1 to MCn, which prevents the characteristics of the memory cells from varying depending on the presence or absence of crystal grain boundaries in the channel region.

Therefore, making the channel regions of the memory cells out of a microcrystalline silicon layer by the above-mentioned manufacturing method makes it possible to provide memory cells with homogeneous characteristics.

(c) Complementary Example

Using FIGS. 18 and 19, a complementary explanation of the first embodiment will be explained.

In the above manufacturing method, amorphous silicon is grown epitaxially by RTA, which enables the microcrystalline silicon layer 3 and epitaxial layer 4 to be formed separately as shown in FIG. 10.

Although the above method can suppress the lateral crystal growth of the epitaxial layer 4, it cannot suppress the lateral crystal growth completely by causing the epitaxial layer to grow only in the longitudinal direction.

Figure 18:
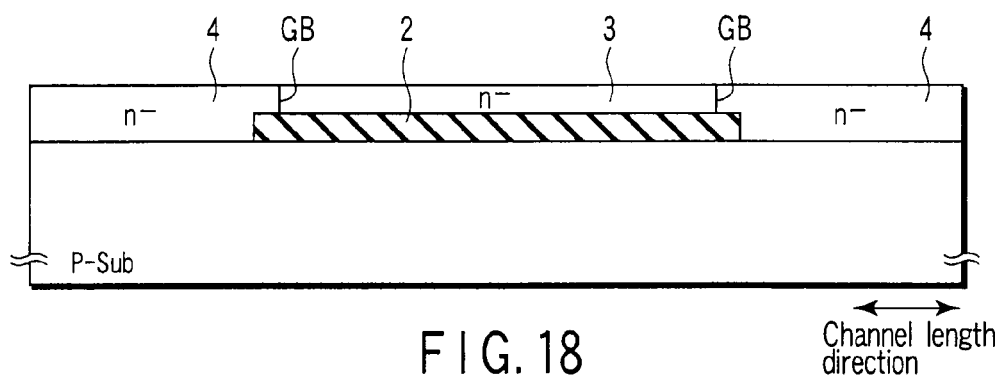
FIG. 18 is a sectional view showing a complementary example of the first embodiment.

Accordingly, the epitaxial layer 4 does not cover the entire surface of the buried oxide film 2 as shown in FIG. 18. However, it is expected that the end of the epitaxial layer 4 will be formed on the end of the buried oxide film 2 as a result of a slight lateral crystal growth.

In this case, there is a grain boundary GB at the interface between the epitaxial layer 4 and the n-type microcrystalline silicon layer 3.

If the crystal grain boundary GB is not formed in the channel region of a memory cell, it will cause no variation in the characteristic of the memory cell, depending on the presence or absence of the crystal grain boundary.

Figure 19:
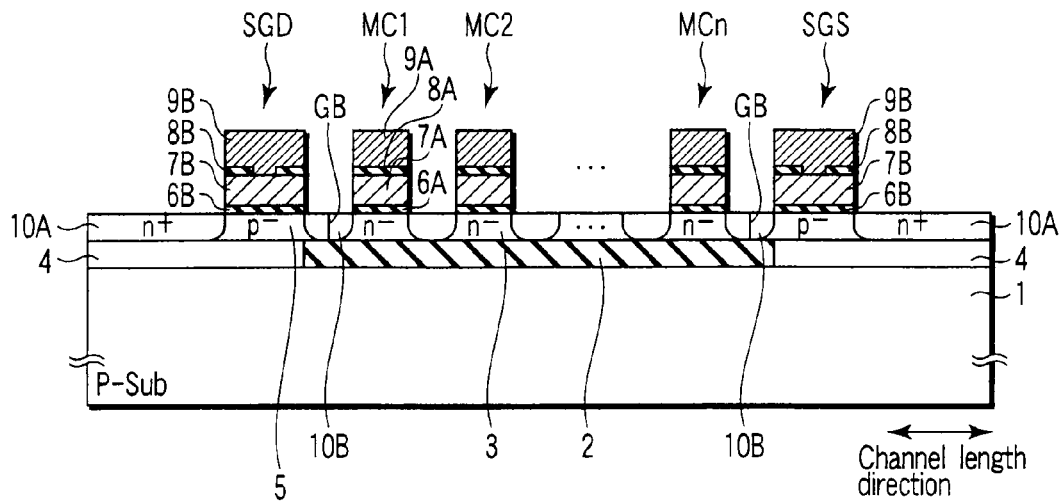
FIG. 19 is a sectional view showing a complementary example of the first embodiment.

Therefore, as shown in FIG. 19, when the grain boundary GB is present in the SOI region between the adjacent memory cell and the select gate transistor, for example, in the n+ diffused layer 10B shared by the select gate transistor and the memory cell, there is no problem with the homogeneity of the memory cells.

(2) Second Embodiment (a) Configuration

Figure 20:
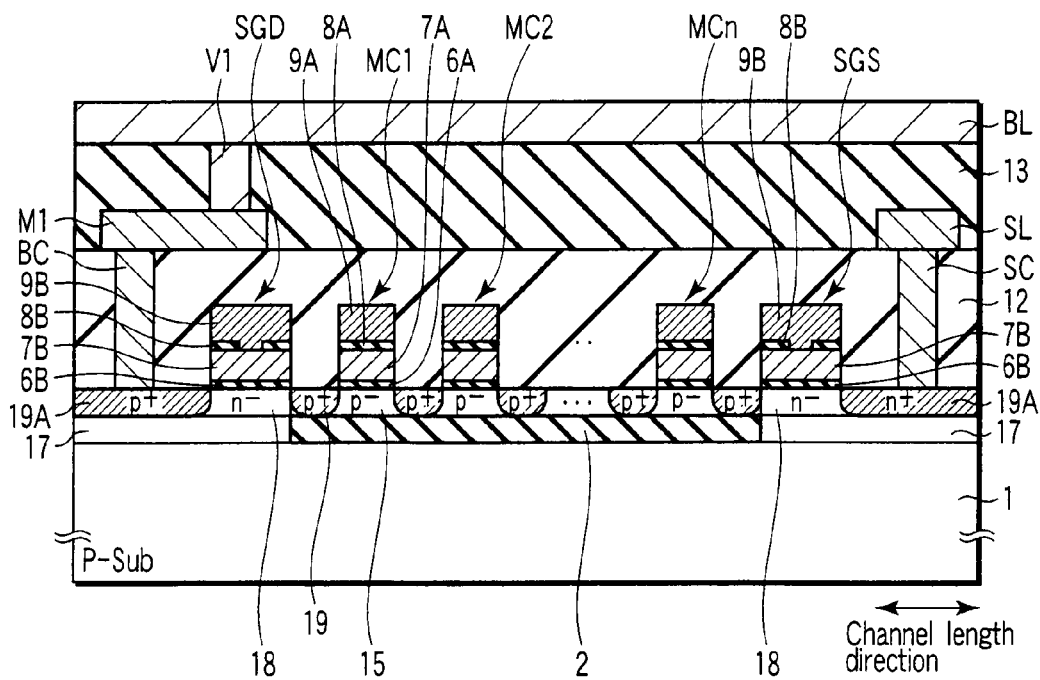
FIG. 20 is a sectional view of a memory cell array section according to a second embodiment of the invention.
Figure 21:
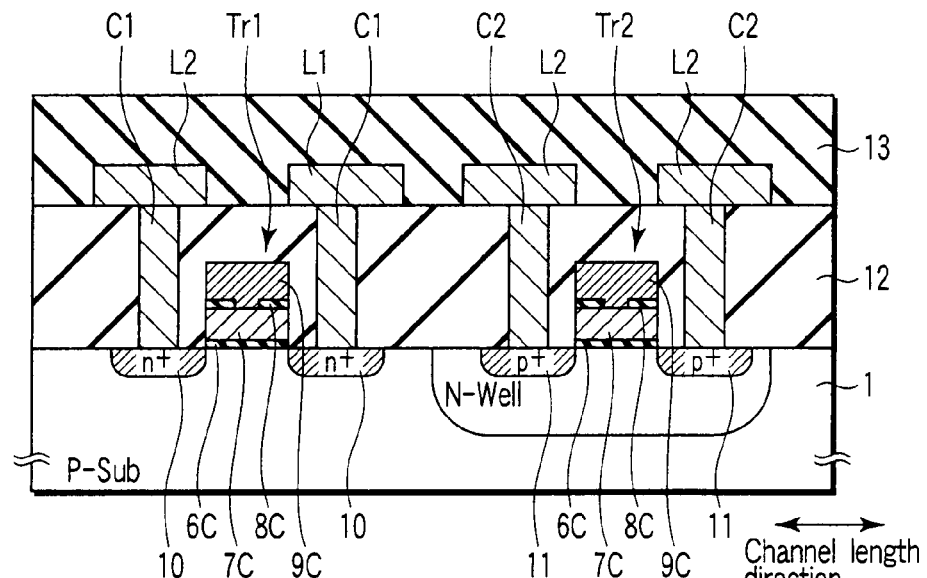
FIG. 21 is a sectional view of a peripheral circuit section of the second embodiment.

FIGS. 20 and 21 show the configuration of a flash memory according to a second embodiment of the invention. The same parts as those of the first embodiment are indicated by the same reference numbers and a detailed explanation will be omitted.

In the second embodiment, a microcrystalline silicon layer constituting an SOI layer is characterized by being a p-type microcrystalline silicon layer 15 doped with, for example, boron (B). The p-type microcrystalline silicon layer 15 is a p⁻-type semiconductor layer doped with a low concentration (for example, about $1 \times 10^{18}$ atom/cm$^3$) of impurities.

Therefore, in the second embodiment, each of the memory cells MC1 to MCn is a p-channel depletion-mode transistor which uses a p-type microcrystalline silicon layer 15 as a channel region and a p+ diffused layer 19 as a source/drain region.

On the other hand, select gate transistors SGD and SGS arranged at both ends of the memory cells MC1 to MCn are arranged on an epitaxial region EA whose crystal axis aligns with that of a semiconductor substrate 1.

The select gate transistors SGS, SGD use as a channel region an n⁻-type semiconductor layer 18 whose crystal axis aligns with that of the semiconductor substrate 1 and the p+ diffused layers 19, 19A as source/drain regions, respectively. The p+ diffused layer 19 is formed in the p-type microcrystalline silicon layer 15 and the p+ diffused layer 19A is formed in the epitaxial layer 17.

The select gate transistors SGS, SGD are connected via the corresponding source/drain regions to the memory cells MC1, MCn and the bit line contact BC and source line contact SC, respectively.

As described in the first embodiment, phosphorus (P), arsenic (As), or the like is used as n-type impurities in the n-type microcrystalline silicon layer. Phosphorus (P) or arsenic (As) is liable to segregate easily at a grain boundary between microcrystals.

For this reason, even if variations in the characteristics of memory cells caused by the presence or absence of a crystal grain boundary have been suppressed by using a microcrystalline silicon layer, the segregation of impurities contributes to variations in the characteristic.

On the other hand, for example, boron (B) used as p-type impurities in the second embodiment diffuses more easily than phosphorus (P) or arsenic (As). Thus, the p-type impurities are less liable to segregate at the grain boundary.

Therefore, according to the second embodiment, using a p-type microcrystalline silicon layer as an SOI layer enables the characteristics of the memory cells to be equalized still more.

(b) Manufacturing Method

Hereinafter, a manufacturing method according to the second embodiment will be described. Explanation of the manufacturing processes of the peripheral circuit section will be omitted.

Figure 22:
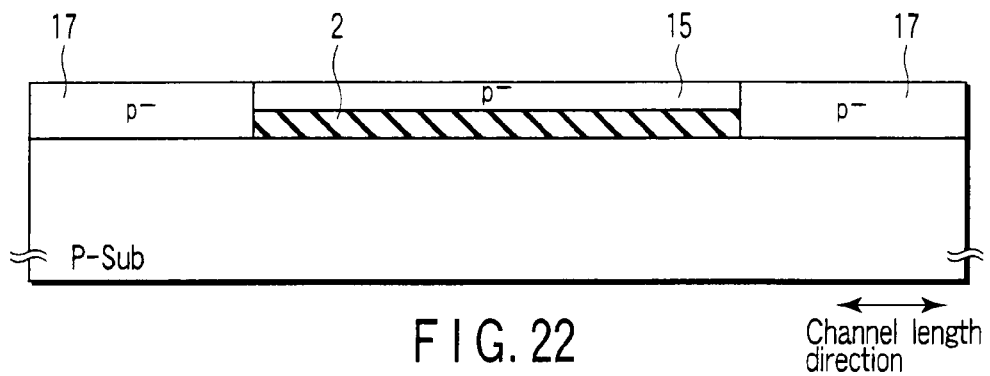
FIG. 22 is a sectional view showing one of the manufacturing processes of the second embodiment.

As shown in FIG. 22, after a buried oxide film 2 is formed in the same process as shown in FIG. 8 of the first embodiment, an amorphous silicon film doped with a low concentration (for example, about $1 \times 10^{18}$ atom/cm$^3$) of, for example, boron (B) as p-type impurities is formed so as to cover the entire surface of the semiconductor substrate 1 and buried oxide film 2.

The semiconductor substrate 1 is heated by RTA under the same conditions as in the process shown in FIG. 10 of the first embodiment. Then, p-type amorphous silicon formed on the buried oxide film 2 is turned into a p-type microcrystalline silicon layer 15.

On the other hand, the p-type amorphous silicon formed on the semiconductor substrate 1 is grown epitaxially, thereby forming a p-type epitaxial layer 17 whose crystal axis aligns with that of the semiconductor substrate 1.

Figure 23:
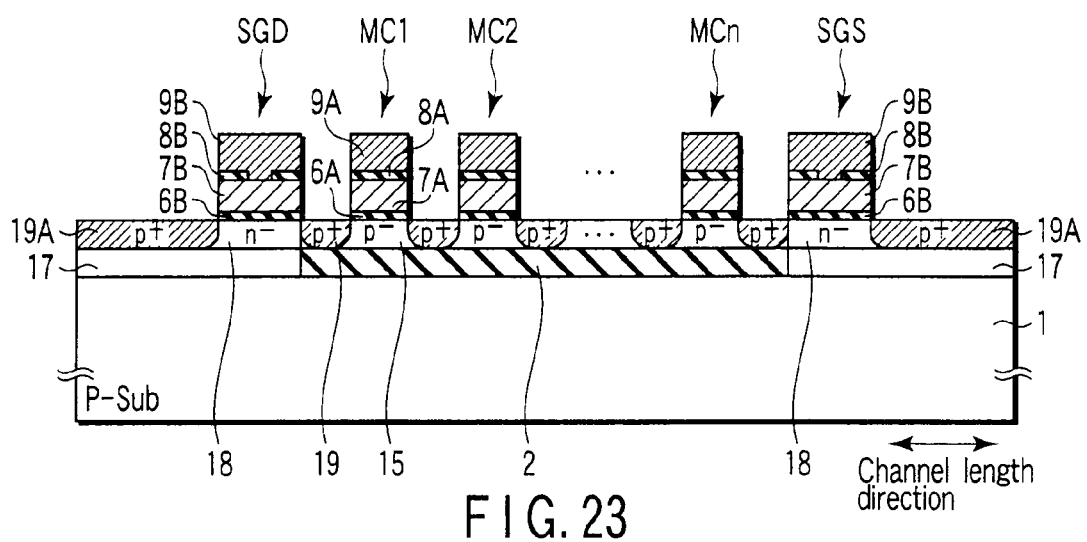
FIG. 23 is a sectional view showing one of the manufacturing processes of the second embodiment.

As shown in FIG. 23, an n⁻-type semiconductor layer 18 which makes the channel regions of the select gate transistors SGD, SGS is formed in the epitaxial layer 17 by, for example, an ion implantation method in the same process as shown in FIGS. 12 to 16.

Then, after the gate electrodes of the memory cells MC1 to MCn and select gate transistors SGS, SGD are formed, p+ diffused layers 19, 19A serving as the source/drain regions of the memory cells and select gate transistors are formed by, for example, an ion implantation method.

As shown in FIG. 20, insulating layers 12, 13, bit lines BL, bit line contact BC, source lines SL, source line contact SC, and others are formed in sequence, which completes a flash memory in the second embodiment.

As described above, in the second embodiment, the SOI layer in which the memory cells MC1 to MCn are arranged is composed of p-type microcrystalline polysilicon layer. This makes it possible to suppress variations in the characteristics of the memory cells MC1 to MCn caused by crystal grain boundaries and further caused by the segregation of impurities.

According to the above-described manufacturing method, it is possible to suppress variations in the characteristics of memory cells and provide memory cells with homogeneous characteristics.

(3) Third Embodiment (a) Configuration

A third embodiment of the invention may be applied to a flash memory where memory cells are stacked almost vertically on the surface of a substrate. FIG. 24 is a perspective view schematically showing the main part of a NAND cell unit serving as a basic unit in the third embodiment. As shown in FIG. 24, a plurality of memory cells MC1 to MCn are arranged on a side face of a pillar-shaped semiconductor layer 20 extending in a direction perpendicular to the surface of the semiconductor substrate 1. The semiconductor layer 20 is the channel region of the memory cells. Select gate transistors SGS, SGD are arranged on the semiconductor substrate 1 and on the side face of the pillar-shaped semiconductor layer 20, respectively.

Using a microcrystalline silicon layer as the channel region of the memory cells MC1 to MCn shown in FIG. 24 makes it possible to suppress variations in the characteristics of the memory cells caused by grain boundaries as in the first and second embodiments.

Figure 25:
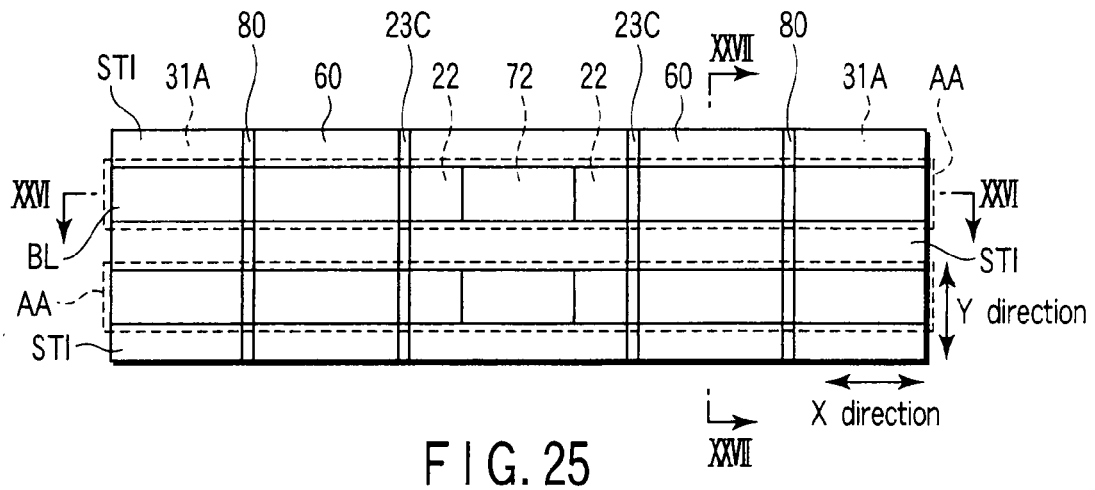
FIG. 25 is a plan view of a memory cell array section according to the third embodiment.
Figure 26:
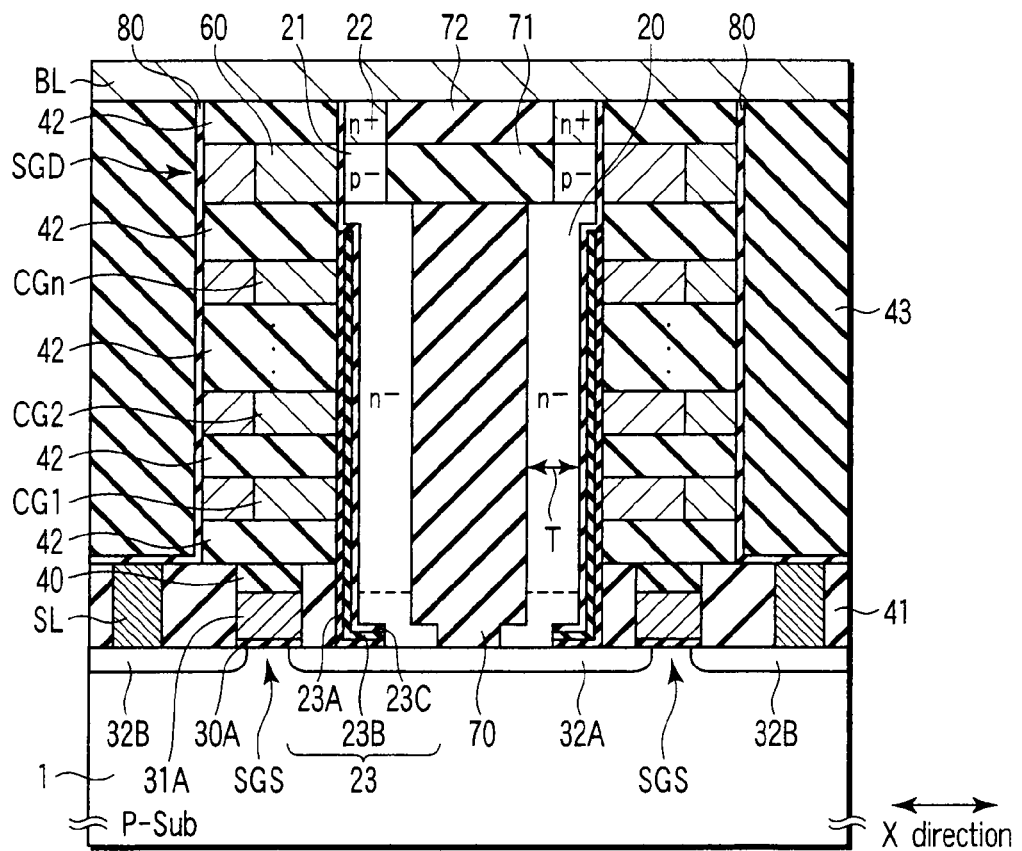
FIG. 26 is a sectional view taken along line XXVI-XXVI of FIG. 25.
Figure 27:
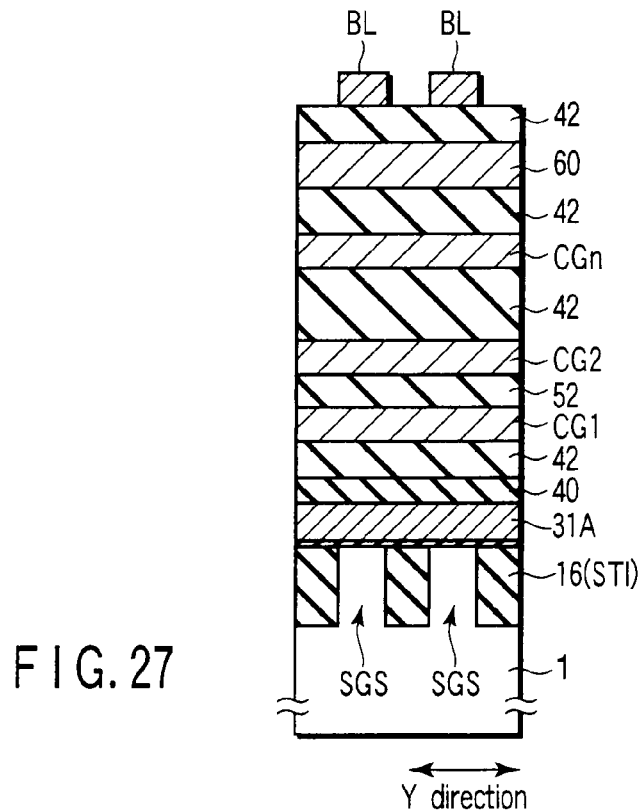
FIG. 27 is a sectional view taken along line XXVII-XXVII of FIG. 25.

Hereinafter, a stacked-structure flash memory of the third embodiment shown in FIG. 24 will be explained using FIGS. 25 to 27. In FIG. 24 and FIGS. 25 to 27, the same members are indicated by the same reference numbers. A vertical memory cell and a vertical transistor described below are MIS transistors whose channels are formed in a direction perpendicular to the surface of the semiconductor substrate.

Figure 28:
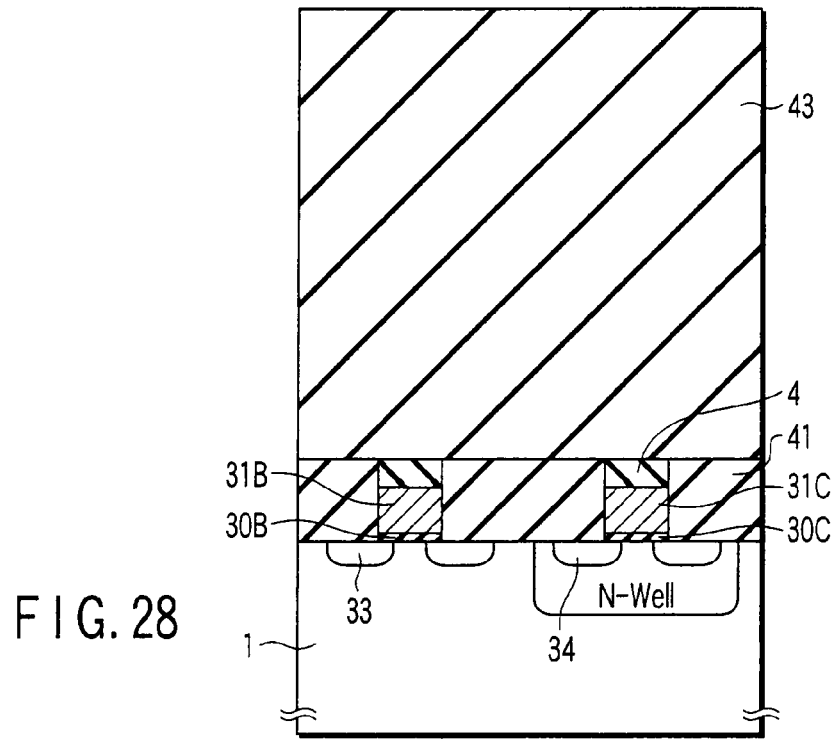
FIG. 28 is a sectional view taken along the channel length of a peripheral transistor.

FIG. 25 is a plan view of a NAND flash memory according to the third embodiment. FIG. 26 is a sectional view taken along line XXVI-XXVI of FIG. 25. FIG. 27 is a sectional view taken along line XXVII-XXVII of FIG. 25. FIG. 26 shows two NAND cell units adjacent in the X-direction. FIG. 28 shows the structure of a peripheral transistor arranged in a peripheral circuit region. FIG. 28 is a sectional view taken along the channel length of a peripheral transistor.

In a memory cell array section, a plurality of NAND cell units are arranged in an active region AA sandwiched between isolation regions STI provided in the semiconductor substrate 1.

In the third embodiment, the memory cells MC1 to MCn are arranged on one side face of a pillar-shaped n-type microcrystalline silicon layer 20 extending almost in a direction perpendicular to the surface of the semiconductor substrate 1 in such a manner that they make vertical memory cells. That is, the pillar-shaped n-type microcrystalline silicon layer 20 is a region in which the memory cells MC1 to MCn are formed. The side faces on which the gate electrodes of the memory cells MC1 to MCn are not formed of the n-type microcrystalline silicon layer 20 are in contact with an insulating film 70, with the result that the memory cell formation region has an SOI structure.

The memory cells MC1 to MCn are stacked one on top of another via interlayer insulating layers 42, thereby forming a stacked body. The n-type microcrystalline silicon layer 20 is an $n^-$-type semiconductor layer doped with a low concentration (for example, about $1 \times 10^{18}$ atom/cm$^3$) of n-type impurities, such as phosphorus (P) or arsenic (As). The memory cells MC1 to MCn are such that control gates CG1 to CGn are connected via a gate insulating film 23 to the side face of the n-type microcrystalline silicon layer 20. The control gate electrodes CG1 to CGn function as word lines extending in the Y-direction and are shared by memory cells adjacent in the Y-direction.

To make their resistance low, each of the control gate electrodes CG1 to CGn has a two-layer structure composed of, for example, a polysilicon layer and a silicide layer obtained by turning a part of the polysilicon layer into silicide. Each of the control gate electrodes CG1 to CGn may have a single-layer structure of a polysilicon layer or a silicide layer. Moreover, each of the control gate electrodes CG1 to CGn may have a single-layer structure of metal, such as tungsten (W), aluminum (Al), or copper (Cu), which makes the control gate electrode have a low resistance. When metal is used as the control gate electrodes CG1 to CGn, a silicide layer is not needed.

Each of the memory cells MC1 to MCn has a MONOS structure. Therefore, the gate insulating film 23 intervening between the control gate electrodes CG1 to CGn and the n-type microcrystal silicon layer 20 has a stacked structure where a charge storage layer 23B is sandwiched between a first and a second insulating films 23A, 23C.

When the charge injected from the n-type microcrystal silicon layer 20 is accumulated in the charge storage layer 23B, or when the charge accumulated in the charge storage layer 23B diffuses into the n-type microcrystal silicon layer 20, the second insulating film 23C acts as a potential barrier. For example, a silicon oxide film is used as the second insulating film 23C and has a film thickness of, for example, about 10 nm.

The charge storage layer 23B traps and accumulates charges (electrons) and functions as a data storage layer for the flash memory. For example, a silicon nitride film is used as the charge storage film 23B and has a film thickness of, for example, about 8 nm.

The first insulating film 23A is arranged between the charge storage layer 23B and the control gate electrodes CG1 to CGn and prevents the charge accumulated in the charge storage layer 23B from diffusing into the control gate electrodes CG1 to CGn. For example, a silicon oxide film is used as the first insulating film 23A and has a film thickness of, for example, about 4 nm.

As the memory cells in the flash memory are microfabricated more and more, a proper write/read operation can be performed without a diffused layer serving as a source/drain region.

Therefore, in the $n^-$-type semiconductor layer 20, each of the memory cells MC1 to MCn does not have a diffused layer acting as a source/drain region whose conductivity type differs from that of the semiconductor layer. That is, the microcrystalline silicon layer 20, an $n^-$-type semiconductor layer, functions as the channel region, source region, and drain region of the memory cell. The memory cells MC1 to MCn almost deplete the n-type microcrystalline silicon layer 20 just under the gate electrode on the basis of the potential applied to the control gate electrodes CG1 to CGn, thereby realizing the off state.

As described above, the memory cells of the third embodiment are vertical memory cells. Accordingly, the film thickness of the gate electrodes CG1 to CGn is a gate length (channel length). Let the gate length be L. Moreover, let the film thickness of the n-type microcrystalline silicon layer 20 serving as a channel region of the memory cell MC be T.

At this time, it is desirable that the gate length L and film thickness T should satisfy the following expression: $1 \text{ nm} < T < L \times 0.8$.

The reason is to read data properly and easily.

Specifically, in a read operation, an inversion layer is formed in a range of about 1 nm from the interface with the gate insulating film 8 in the channel region just under the gate electrodes CG1 to CGn. Thus, when the film thickness T becomes less than 1 nm, the carrier surface density in the inversion layer drops sharply and the bit line current decreases. As a result, it becomes difficult to read data. On the other hand, to perform a read operation properly, the cut-off characteristic of the memory cell has to be made good. For this reason, it is desirable that the upper limit of the film thickness T should satisfy the above expression.

Since the whole of the gate insulating film 23 including the charge storage layer 23B is an insulating material in the memory cells MC1 to MCn, the floating gate electrodes as a storage layer need not be separated cell by cell as in the floating-gate memory cells. That is, the gate insulating film 23 has only to be formed on the entire side face of the n-type microcrystal silicon layer 20, eliminating the need for patterning, which easily realizes a structure where vertical memory cells are stacked vertically.

Furthermore, the distance between gate electrodes CG, that is, the film thickness of the interlayer insulating layer 42, is set to a thickness equal to the film thickness of, for example, the gate electrodes CG1 to CGn.

Select gate transistors SGD, SGS are arranged at one and the other end of the plurality of memory cells MC1 to MCn.

Of the select gate transistors, the select gate transistor (second select gate transistor) SGD at one end (drain side) of the plurality of the memory cells MC1 to MCn is located at the highest end of the stacked body composed of memory cells and is formed so as to function as a vertical transistor with a p⁻-type semiconductor layer 21 as a channel region.

The p⁻-type semiconductor layer 21 is a microcrystalline silicon layer doped with a low concentration (for example, about $1\times10^{18}$ atom/cm³) of p-type impurities (e.g., boron). Moreover, in the select gate transistor SGD, the n-type microcrystalline silicon layer 20 in which memory cells MC are arranged is used as a source region and an n⁺ diffused layer 22 located at the highest end of the pillar-shaped semiconductor layer is used as a drain region. The n⁺ diffused layer 22 is a microcrystalline silicon layer doped with a high concentration (for example, $1\times10^{20}$ atom/cm³) of n-type impurities. As described above, the select gate transistor SGD functions as a p-channel enhancement-mode MIS transistor.

A bit line BL is connected to the n⁺ diffused layer 22. The bit line BL is shared by two NAND cell units adjacent in the X direction.

Of the stacked-structure gate insulating films 23 of the memory cells MC1 to MCn, a second insulating film 23C is used as a gate insulating film in the select gate transistor SGD. As for the gate insulating film of the select gate transistor SGD, an insulating film separately formed may be used as the gate insulating film instead of using the insulating film 23C as the gate insulating film.

Since the select gate transistor SGD is a vertical transistor, the film thickness of the gate electrode is the gate length.

The gate length (film thickness) of the select gate transistor SGD is set greater than the gate length (film thickness) of the memory cell. The reason is to make the cut-off characteristic of the select gate transistor SGD good. For example, if the gate length (film thickness) of the gate electrode of the memory cell is about 30 nm, the gate length (film thickness) of the select gate transistor SGD is set to about 150 nm.

On the other hand, the select gate transistor (first select gate transistor) SGS at the other end (source side) of the plurality of memory cells MC1 to MCn is arranged on the semiconductor substrate 1. The select gate transistor SGS and the n-type microcrystalline silicon layer 20 have a specified distance between them to secure a withstand voltage.

The select gate transistor SGS has a gate electrode 31A on a gate insulating film 30A formed on the surface of the semiconductor substrate 1.

In the select gate transistor SGS, for example, n-type diffused layers 32A, 32B formed in the semiconductor substrate 1 are used as source/drain regions. The diffused layer 32A serving as the drain region of the select gate transistor SGS is connected to the pillar-shaped n-type microcrystalline silicon layer 20. The diffused layer 32B serving as the source region is connected to a source line SL. The source line SL and the select gate transistor SGS have a distance between them to secure a withstand voltage.

The source line SL is formed in an insulating film 41. The top surface of the source line SL is set in a position equal to or lower than the underside of the control gate electrode CG1 closest to the semiconductor substrate 1 among the plurality of control gate electrodes CG1 to CGn. With the above configuration, the source line SL does not lie next to the memory cells MC1 to MCn. Therefore, a great distance need not be secured between the memory cells MC1 to MCn and the source line SL to increase the withstand voltage between the memory cells MC1 to MCn and the source line SL. Therefore, the chip area can be reduced.

Furthermore, to reduce the chip area, it is desirable that the select gate transistor SGS should be located below the stacked body composed of the gate electrodes CG1 to CGn of the memory cells and the interlayer insulating film 42. Therefore, it is desirable to secure a greater distance between the select gate transistor SGS and the gate electrode CG1, for example, using the large thickness of the interlayer insulating film 42 to prevent the transistor SGS and electrode CG1 from affecting each other. In the third embodiment, the distance is secured by the interlayer insulating layer 42 and a mask material 40 on the gate electrode 31A.

Peripheral transistors Tr1, Tr2 formed in the peripheral circuit section, which use an n-type and a p-type diffused layer 33, 34 formed in the semiconductor substrate 1 as source/drain regions, are arranged on the semiconductor substrate 1. Moreover, the peripheral transistors Tr1, Tr2 have gate electrodes 31B, 31C on gate insulating films 30B, 30C formed at the surface of the semiconductor substrate 1, respectively.

The select gate transistor SGS on the source side and peripheral transistors Tr1, Tr2 are p- or n-channel enhancement-mode MIS transistors whose threshold voltage is controlled easily.

Two NAND cell units adjacent in the X-direction are arranged on a single diffused layer 32A formed in the semiconductor substrate 1. Through the diffused layer 32A, two pillar-shaped n-type microcrystalline silicon layers 20 are connected electrically to the select gate transistors SGS on the respective source sides.

The pillar-shaped n-type microcrystalline silicon layers 20 in which memory cells are arranged are separated from one another in the X-direction on a NAND cell unit basis. To reduce the chip area, the distance between two n-type microcrystalline silicon layers 20 is set so as to be less than the distance between the select gate transistor SGS and the source line SL.

An insulating layer 70, 71 and 72 intervenes between two n-type microcrystalline silicon layers 20, with the result that a region in which memory cells are formed has an SOI structure.

As described above, the n-type microcrystalline silicon layer 20 is used as a semiconductor layer in which the memory cells MC1 to MCn are formed, which causes crystal grain boundaries to mediate in the individual channel regions of the memory cells MC1 to MCn. Therefore, according to the third embodiment, it is possible to suppress variations in the characteristics of memory cells caused by the presence or absence of crystal grain boundaries, which enables the characteristics of memory cells to be equalized. Furthermore, a stacked structure NAND flash memory is formed using vertical memory cells, which realizes high integration.

While in the third embodiment, a case where memory cells are arranged in a pillar-shaped n-type microcrystalline silicon layer has been explained, a p-type microcrystalline silicon layer may be used. At that time, an n-channel enhancement-mode MIS transistor which uses an n-type semiconductor layer as a channel region and a p-type microcrystalline silicon layer (p⁻-type semiconductor layer) and a p⁺-type semiconductor layer as a source/drain region is used as the select gate transistor SGS. In this case, it is possible to suppress variations in the characteristics of memory cells caused by the presence or absence of crystal grain boundaries and further suppress the segregation of impurities into crystal grain boundaries, and equalize the characteristics of memory calls.

(b) Manufacturing Method

Hereinafter, referring to FIGS. 29 to 44, a method of manufacturing a flash memory according to the third embodiment will be explained. FIGS. 29, 31, 33, 35, 37, 39, 41, and 43 show the process of manufacturing a memory cell array section. FIGS. 30, 32, 34, 36, 38, 40, 42, and 44 show the process of manufacturing a peripheral circuit section.

After a well region is formed in the semiconductor substrate 1, a gate insulating film, such as a silicon oxide film, is formed on the semiconductor substrate 1 by thermal oxidation method. A gate electrode, such as a polysilicon film, and a mask material, such as a silicon nitride film, are formed on the semiconductor substrate 1 sequentially by, for example, CVD method.

Figure 29:
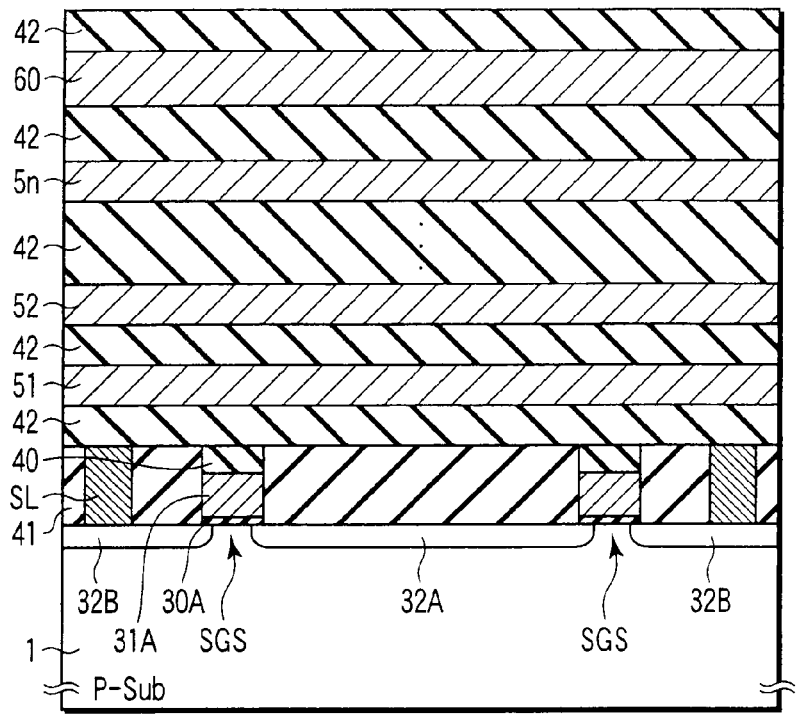
FIG. 29 is a sectional view showing one of the manufacturing processes of the third embodiment.
Figure 30:
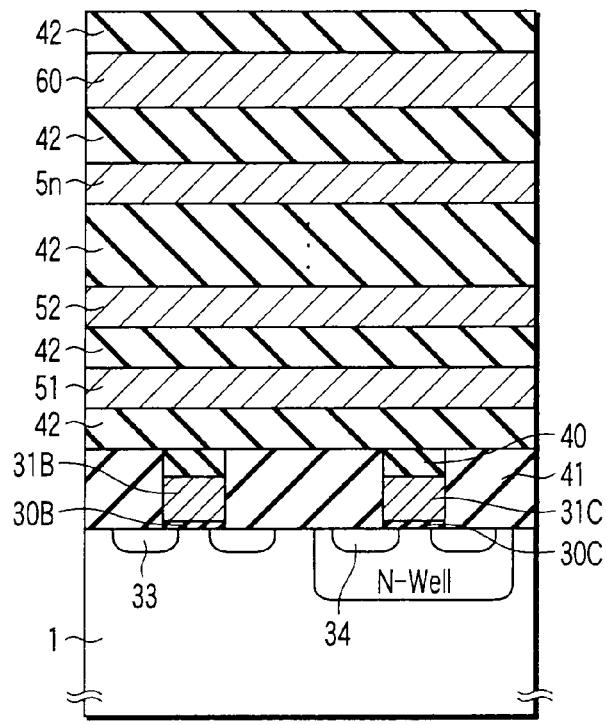
FIG. 30 is a sectional view showing one of the manufacturing processes of the third embodiment.

Then, after the silicon nitride film is patterned, the patterned film is etched by, for example, RIE method. Consequently, as shown in FIGS. 29 and 30, with the mask material 40 as a mask, the gate electrode 31A of the select gate transistor SGS and the gate electrodes 31B, 31C of the peripheral transistors Tr1, Tr2 are formed on the gate insulating films 30A, 30B, 30C at the surface of the semiconductor substrate 1, respectively. Thereafter, diffused layers 32A, 32B, 33, 34 are formed by, for example, an ion implantation method.

Thereafter, an insulating layer 41 is formed so as to align with the top end of the mask material 40 by, for example, CVD and CMP method. Moreover, the source line SL is connected via an opening made in the insulating layer 41 to the diffused layer 32B serving as the source region of the select gate transistor SGS. Contact plugs connected to the source/drain diffused layers 33, 34 of the peripheral transistors may be formed at the same time that the source line SL is formed.

An interlayer insulating layer 42 and gate electrodes 51 to 5n, 60 are stacked alternately on the insulating layer 41 and mask material 40 by, for example, CVD method. While in the third embodiment, the gate electrodes 51 to 5n have been made of, for example, polysilicon, they may be made of such metal as tungsten (W), aluminum (Al), or copper (Cu).

Then, as shown in FIGS. 31 and 32, the interlayer insulating film 42 and gate electrodes 51 to 5n, 60 are selectively etched by, for example, photolithographic techniques and RIE method, thereby making in the memory cell array section such an opening as exposes the surface of the diffused layer 32A. Thereafter, a first insulating film 23A (e.g., silicon oxide film) and a charge storage layer 23B (e.g., silicon nitride film) are formed in sequence on the side surface facing the opening of the interlayer insulating layer 42 and gate electrodes 51 to 5n, 60 by, for example, CVD method.

Figure 33:
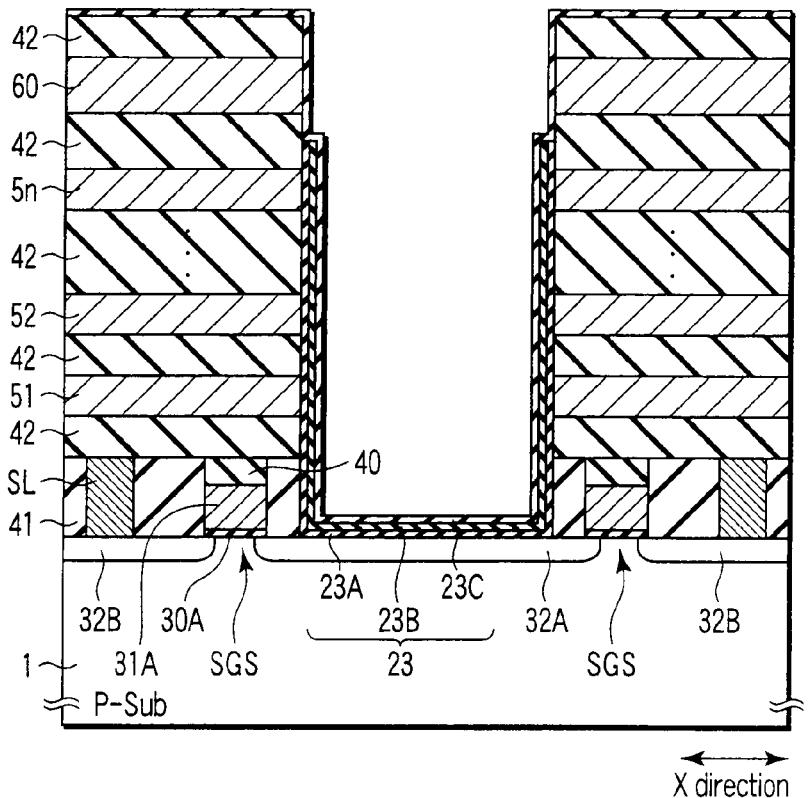
FIG. 33 is a sectional view showing one of the manufacturing processes of the third embodiment.
Figure 34:
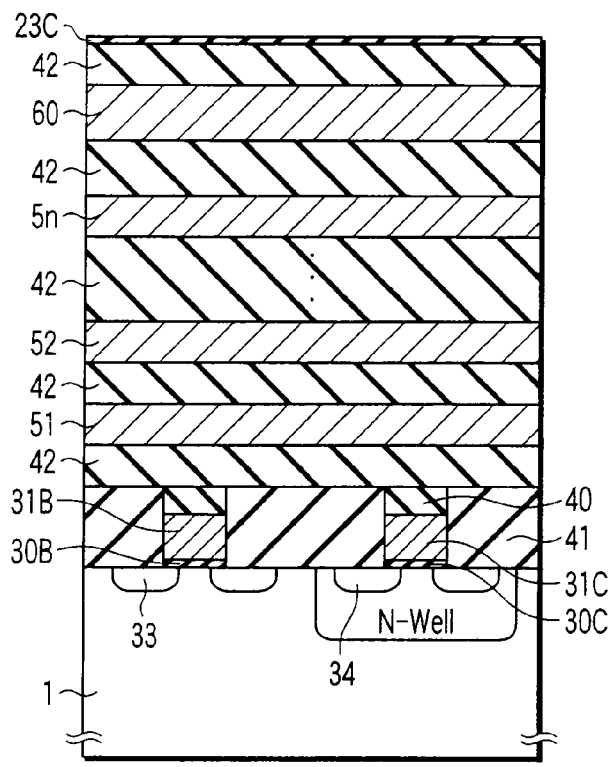
FIG. 34 is a sectional view showing one of the manufacturing processes of the third embodiment.

As shown in FIGS. 33 and 34, the charge storage layer 23B and first insulating film 23A are selectively etched so that the side face of the gate electrode 60 may be exposed. Then, a second insulating layer 23C is formed on the side face of the charge storage layer 23B and on the side face of the gate electrode 60.

Figure 35:
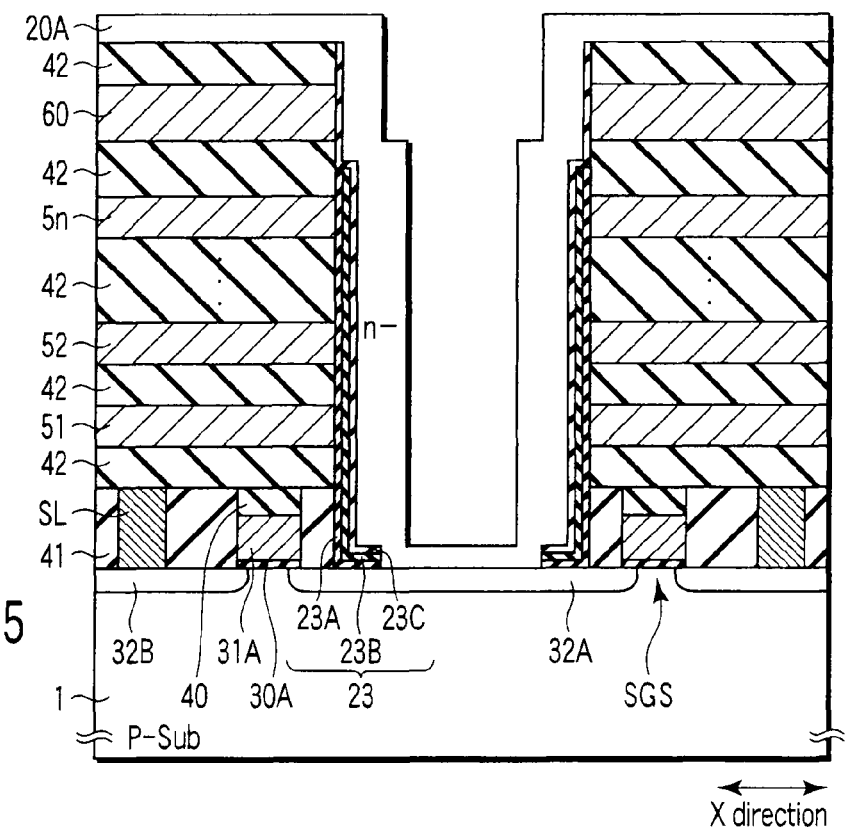
FIG. 35 is a sectional view showing one of the manufacturing processes of the third embodiment.
Figure 36:
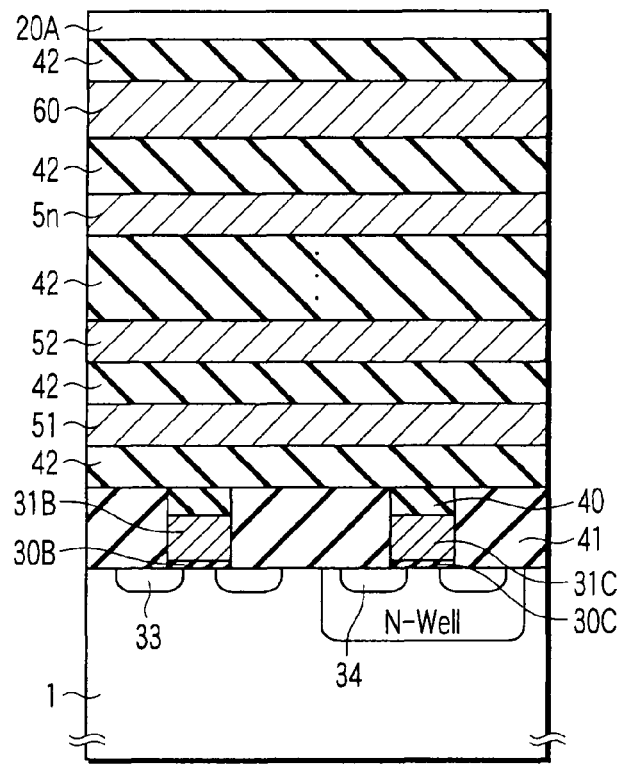
FIG. 36 is a sectional view showing one of the manufacturing processes of the third embodiment.

Thereafter, as shown in FIGS. 35 and 36, the insulating film 23 is selectively etched by anisotropic etching, thereby forming an amorphous silicon film 20A doped with, for example, a low concentration (for example, about $1\times10^{18}$ atom/cm$^3$) of phosphorus (P) or arsenic (As) on the side face of the first insulating film on the semiconductor substrate 1.

Figure 37:
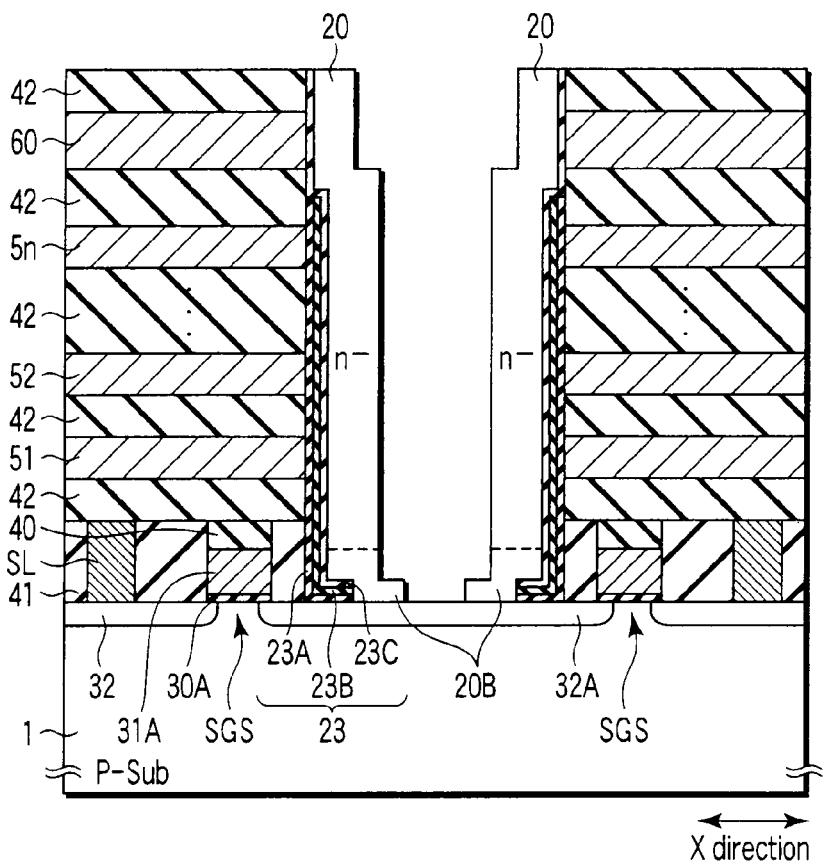
FIG. 37 is a sectional view showing one of the manufacturing processes of the third embodiment.
Figure 38:
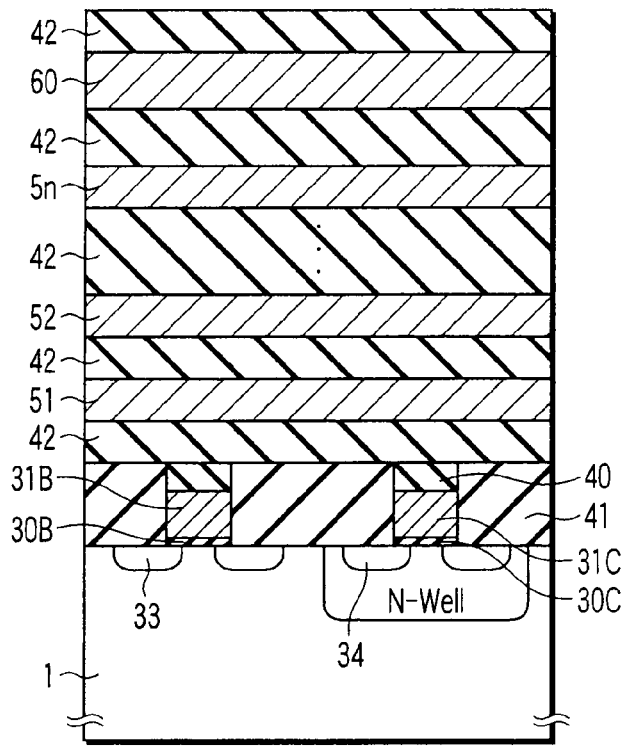
FIG. 38 is a sectional view showing one of the manufacturing processes of the third embodiment.

The amorphous silicon layer is selectively etched by anisotropic etching techniques, thereby separating the amorphous silicon layer in the X-direction. Thereafter, the semiconductor substrate 1 is heated quickly by, for example, RTA in such a manner that the temperature of the substrate rises to 600° C. or higher. Then, as shown in FIGS. 37 and 38, on the lower end side contacting the semiconductor substrate 1 of the amorphous silicon film, an epitaxial layer 20B whose crystal axis aligns with that of the semiconductor substrate 1 is formed. On the other hand, in the memory cell formation region of the amorphous silicon film, an n-type microcrystalline silicon layer 20 is formed. Heating is done by RTA in a period from when the amorphous silicon in the memory cell formation region is micro-crystallized until before epitaxial growth on the semiconductor substrate 1 reaches the memory cell formation region.

Figure 39:
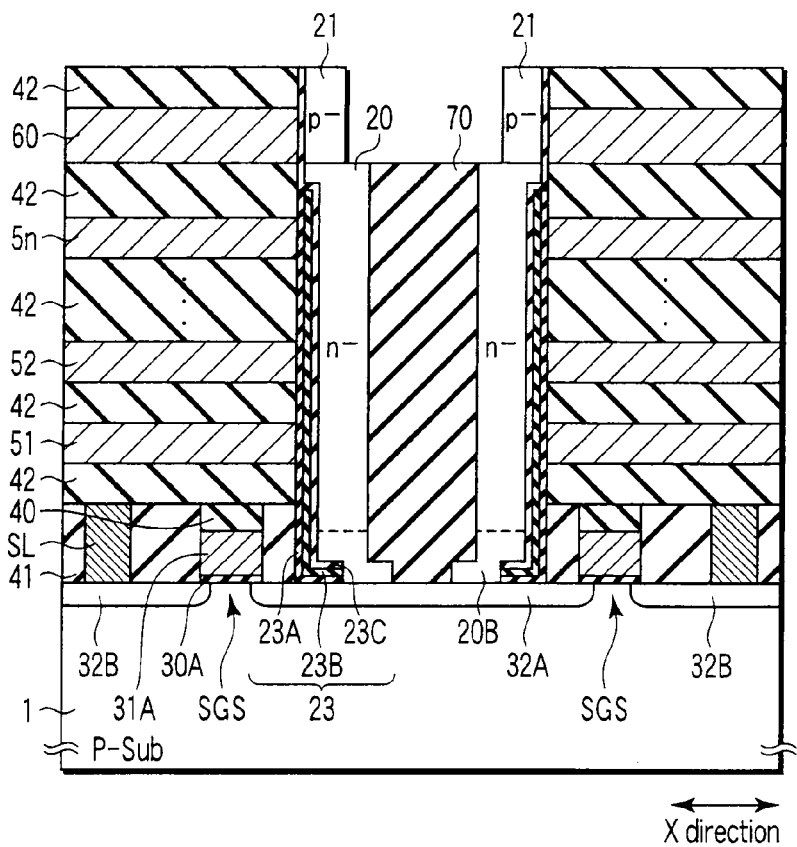
FIG. 39 is a sectional view showing one of the manufacturing processes of the third embodiment.
Figure 40:
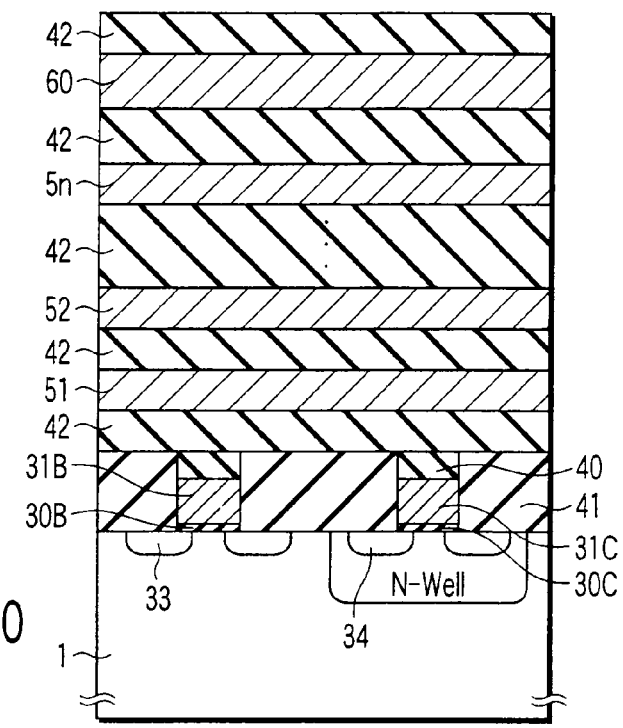
FIG. 40 is a sectional view showing one of the manufacturing processes of the third embodiment.

Then, as shown in FIGS. 39 and 40, an insulating layer 70 is formed on the side face of the n-type microcrystal silicon layer 20 and on the semiconductor substrate 1 so as to fill the opening. The top surface of the insulating layer 70 is set almost in the same position as that of the underside of the gate electrode 60. Thereafter, the exposed region above the top surface of the insulating layer 70 is doped with a low concentration (e.g., about $1\times10^{18}$ atom/cm$^3$) of p-type impurities (e.g., boron). Then, a p$^-$-type semiconductor layer 21 serving as the channel region of the select gate transistor on the drain side is formed.

As shown in FIGS. 41 and 42, an insulating layer 71 is formed on the insulating layer 70. At this time, the top surface of the insulating layer 71 is set almost in the same position as that of the top surface of the gate electrode 60. Thereafter, the exposed region above the top surface of the insulating layer 71 is doped with a high concentration (e.g., about $1\times10^{20}$ atom/cm$^3$) of n-type impurities. Then, an n$^+$ diffused layer 22 serving as the drain region of the select gate transistor is formed.

Figure 43:
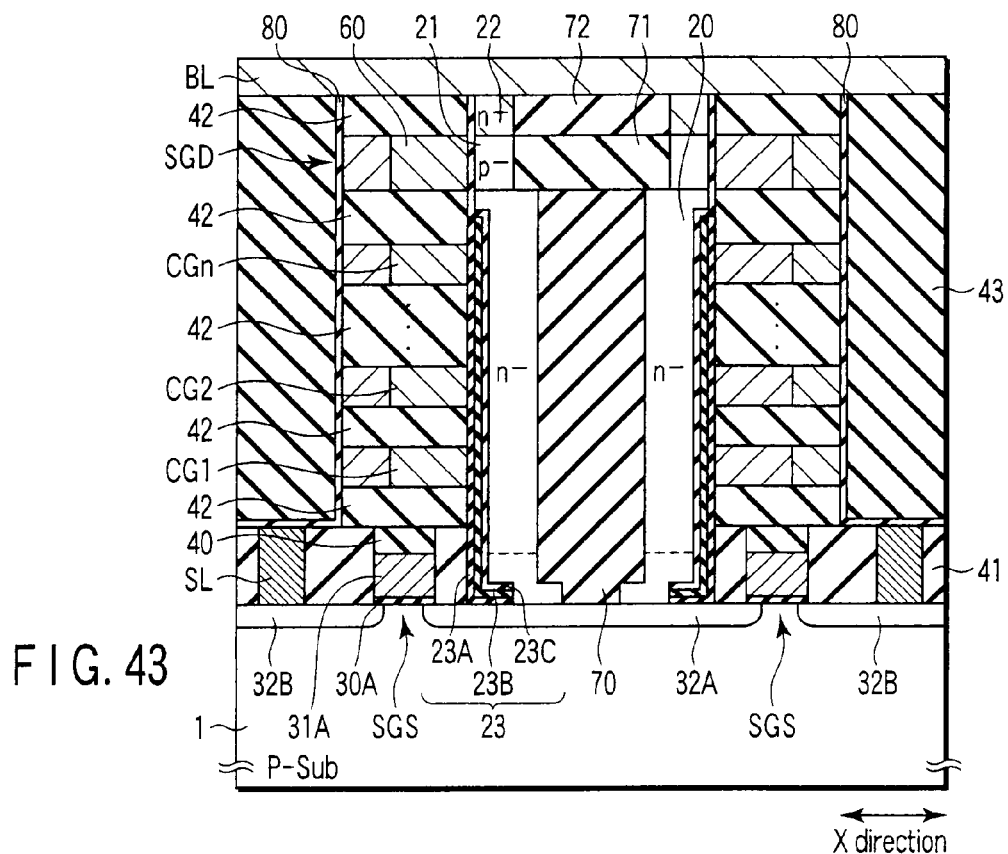
FIG. 43 is a sectional view showing one of the manufacturing processes of the third embodiment.
Figure 44:
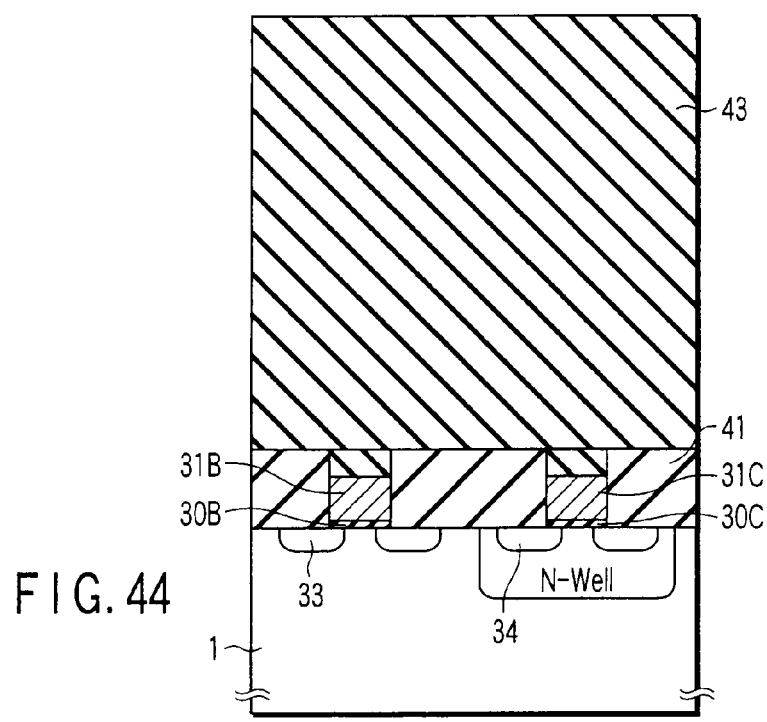
FIG. 44 is a sectional view showing one of the manufacturing processes of the third embodiment.

Then, as shown in FIGS. 43 and 44, an insulating layer 72 is formed on the insulating layer 71. Thereafter, the region above the source line SL is selectively etched, thereby making an opening. The opening is filled with high-melting-point metal, such as tungsten (W), thereby silicifying the gate electrode composed of a polysilicon film from the side face of the opening to form control gate electrodes CG1 to CGn. Then, after the tungsten left in the opening is removed, a passivation film 80 is formed. Moreover, after the stacked body formed on the top surface of the insulating layer 41 of the peripheral circuit section is removed, an insulating layer 43 is formed in the opening and on the surface of the peripheral circuit section.

The n-type microcrystalline silicon layer 20, p$^-$-type semiconductor layer 21, n$^+$ diffused layer 22, and epitaxial layer 20B are selectively etched so as to produce a pillar-shaped semiconductor layer on a NAND cell unit basis. The resulting layers are separated in the Y-direction. The openings (not shown) made by the separation in the Y-direction are filled with an insulating layer (not shown). Thereafter, bit lines BL extending in the X-direction are formed so as to connect electrically with the n$^+$ diffused layer 22. The process of separating the semiconductor layer so as to produce a pillar-shaped semiconductor layer on a NAND cell unit basis is not limited to the sequence of the abovementioned manufacturing processes. For instance, it may be carried out at the same time as the process of separating the amorphous silicon layer in the X-direction. By the above processes, a flash memory of the third embodiment is completed.

By the above manufacturing method, a pillar-shaped semiconductor layer serving as the channel region of the memory cell in a stacked-structure flash memory composed of vertical memory cells may be made of a microcrystalline silicon layer.

Therefore, according to the third embodiment, it is possible to suppress variations in the characteristics of the memory cells MC1 to MCn and therefore provide memory cells whose characteristics are homogeneous. Furthermore, use of a stacked-structure flash memory using vertical memory cells enables high integration.

3. Others

The embodiments of the invention enable memory cells with homogeneous characteristics to be produced in an SOI region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a semiconductor substrate;
   a pillar-shaped semiconductor layer which extends in a vertical direction toward the surface of the semiconductor substrate;
   a plurality of memory cells which are arranged in the vertical direction on the side face of the semiconductor layer and each of which has a charge storage layer and a control gate electrode,
   wherein the pillar-shaped semiconductor layer is made of a microcrystalline layer.

2. The nonvolatile semiconductor memory according to claim 1, further comprising a first select gate transistor which is arranged on the semiconductor substrate and at the end of the plurality of memory cells on the semiconductor substrate side and which is connected to the semiconductor layer via a diffused layer, and a second select gate transistor which is arranged on the side face of the semiconductor layer and at the end of the plurality of memory cells on the opposite side of the semiconductor substrate side.

3. The nonvolatile semiconductor memory according to claim 1, wherein the grain diameter of microcrystals constituting the microcrystalline layer is less than half the smaller of the channel length and channel width of the memory cell.

4. The nonvolatile semiconductor memory according to claim 2, wherein the gate electrode of the first select gate transistor is below the control gate electrode of the memory cell via an interlayer insulating film.

5. The nonvolatile semiconductor memory according to claim 2, further comprising a source line connected to the first select gate transistor,
   wherein the top surface of the source line is in a position lower than the underside of the control gate electrode of the memory cell closest to the semiconductor substrate side of the plurality of memory cells.

6. The nonvolatile semiconductor memory according to claim 1, wherein the memory cells are depletion-mode MONOS-structure transistors which have in the semiconductor layer no diffused layer serving as a source/drain region of the conductivity differing from that of the semiconductor layer.

7. The nonvolatile semiconductor memory according to claim 2, wherein the first and second select gate transistors are enhancement-mode MIS transistors.

8. The nonvolatile semiconductor memory according to claim 2, wherein each of the memory cells further has a first insulating film provided between the control gate electrode and the charge storage layer and a second insulating layer provided between the charge storage layer and the semiconductor layer.

9. The nonvolatile semiconductor memory according to claim 8, wherein the second insulating film is provided between the gate electrode of the second select gate transistor and the semiconductor layer.

10. The nonvolatile semiconductor memory according to claim 2, wherein the gate length of the second select gate transistor is greater than the control gate length of the memory cells.

11. The nonvolatile semiconductor memory according to claim 1, wherein, if the film thickness of the semiconductor layer is T and the gate length of the memory cells is L, T is greater than 1 nm and less than L×0.8.

12. The nonvolatile semiconductor memory according to claim 1, further comprising a peripheral transistor arranged on the semiconductor substrate, wherein the peripheral transistor is an enhancement-mode MIS transistor.

* * * * *